US012733379B2

(12) United States Patent
Zhang et al.

(10) Patent No.: US 12,733,379 B2
(45) Date of Patent: Sep. 8, 2026

(54) DISPLAY PANEL AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yuanqi Zhang, Beijing (CN); Yi Zhang, Beijing (CN); Chang Luo, Beijing (CN); Yang Zeng, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 381 days.

(21) Appl. No.: 18/683,347

(22) PCT Filed: May 23, 2023

(86) PCT No.: PCT/CN2023/095752
§ 371 (c)(1),
(2) Date: Feb. 13, 2024

(87) PCT Pub. No.: WO2024/001616
PCT Pub. Date: Jan. 4, 2024

(65) Prior Publication Data

US 2024/0431180 A1 Dec. 26, 2024

(30) Foreign Application Priority Data

Jun. 29, 2022 (CN) ......................... 202210753233.3

(51) Int. Cl.
*H10K 59/80* (2023.01)
*H10K 59/122* (2023.01)
(Continued)

(52) U.S. Cl.
CPC ......... *H10K 59/873* (2023.02); *H10K 59/122* (2023.02); *H10K 59/40* (2023.02); *H10K 77/111* (2023.02)

(58) Field of Classification Search
CPC .... H10K 50/00; H10K 50/842; H10K 50/844; H10K 59/00; H10K 59/12; H10K 59/122;
(Continued)

(56) References Cited

U.S. PATENT DOCUMENTS

2019/0019966 A1* 1/2019 Jiang .................... H10K 59/131
2019/0057632 A1* 2/2019 Kim ........................ G09G 3/006
2021/0273198 A1* 9/2021 Cheng ................... G06F 3/0412

FOREIGN PATENT DOCUMENTS

CN 108649133 A 10/2018
CN 110112306 A 8/2019
(Continued)

*Primary Examiner* — Brook Kebede
(74) *Attorney, Agent, or Firm* — The Webb Law Firm

(57) ABSTRACT

A display panel includes a display substrate and a touch function layer. The display substrate includes a substrate, a first barrier wall, an organic structure and a film encapsulation layer. The organic structure is on the substrate and surrounds the first barrier wall. The organic structure includes at least one organic layer. The film encapsulation layer is on a side of the first barrier wall away from the substrate. An inorganic encapsulation layer in the film encapsulation layer covers the first barrier wall. On the substrate, an orthographic projection of the inorganic encapsulation layer is non-overlapping with an orthographic projection of the organic structure. The touch function layer includes an inorganic dielectric layer contacting the film encapsulation layer. The inorganic dielectric layer covers the first barrier wall. On the substrate, an orthographic projection of the inorganic dielectric layer is non-overlapping with the orthographic projection of the organic structure.

20 Claims, 14 Drawing Sheets

(51) Int. Cl.
*H10K 59/40* (2023.01)
*H10K 77/10* (2023.01)

(58) Field of Classification Search
CPC ...... H10K 59/40; H10K 59/80; H10K 59/873; H10K 59/8731; H10K 77/10; H10K 77/111; Y02E 10/549
See application file for complete search history.

(56) References Cited

FOREIGN PATENT DOCUMENTS

| | | | |
|---|---|---|---|
| CN | 112467061 | A | 3/2021 |
| CN | 112799550 | A | 5/2021 |
| CN | 112951096 | A | 6/2021 |
| CN | 113419641 | A | 9/2021 |
| CN | 113835557 | A | 12/2021 |
| CN | 113888963 | A | 1/2022 |
| CN | 114138136 | A | 3/2022 |
| CN | 219042432 | U | 5/2023 |

* cited by examiner

DISPLAY PANEL AND DISPLAY APPARATUS

CROSS-REFERENCE TO RELATED APPLICATIONS

This application is the United States national phase of International Patent Application No. PCT/CN2023/095752, filed May 23, 2023, and claims priority to Chinese Patent Application No. 202210753233.3, filed Jun. 29, 2022, the disclosures of which are hereby incorporated by reference in their entireties.

BACKGROUND OF THE INVENTION

Field of the Invention

The present disclosure relates to the field of display technologies, and in particular, to a display panel and a display apparatus.

Description of Related Art

With the development of display technologies, display apparatuses with touch function are favored because they are easy and convenient to operate, and bring great user experience. The touch function is generally realized by providing a touch function layer of a flexible multi-layer structure (flexible multiple layers on cell, FMLOC for short) on an encapsulation layer of a display substrate.

SUMMARY OF THE INVENTION

In another aspect, a display panel is provided. The display panel has a display area and a peripheral area. The display panel includes a display substrate and a touch function layer. The display substrate includes a substrate, a first barrier wall, an organic structure and a film encapsulation layer. The first barrier wall is provided on a first side of the substrate, and the first barrier wall is located in the peripheral area and surrounds the display area. The organic structure is provided on the first side of the substrate and surrounds the first barrier wall. The organic structure includes at least one organic layer. The film encapsulation layer is provided on a side of the first barrier wall away from the substrate. An inorganic encapsulation layer in the film encapsulation layer covers the first barrier wall, and an orthographic projection of the inorganic encapsulation layer on the substrate is non-overlapping with an orthographic projection of the organic structure on the substrate. The touch function layer is provided on a side of the film encapsulation layer away from the substrate. The touch function layer includes an inorganic dielectric layer in contact with the film encapsulation layer, the inorganic dielectric layer covers the first barrier wall, and an orthographic projection of the inorganic dielectric layer on the substrate is non-overlapping with the orthographic projection of the organic structure on the substrate.

In some embodiments, an area of the orthographic projection of the inorganic encapsulation layer on the substrate is less than or equal to an area of the orthographic projection of the inorganic dielectric layer on the substrate.

In some embodiments, at least a portion of a boundary of the inorganic encapsulation layer is flush with at least a portion of a boundary of the inorganic dielectric layer.

In some embodiments, the inorganic dielectric layer covers at least a portion of a boundary of the inorganic encapsulation layer.

In some embodiments, the orthographic projection of the inorganic encapsulation layer on the substrate is located within a range of the orthographic projection of the inorganic dielectric layer on the substrate; alternatively, the orthographic projection of the inorganic encapsulation layer on the substrate coincides with the orthographic projection of the inorganic dielectric layer on the substrate.

In some embodiments, a distance between an outer boundary of an orthographic projection of the first barrier wall on the substrate and a boundary of the orthographic projection of the inorganic encapsulation layer on the substrate ranges from: 80 μm to 130 μm.

In some embodiments, the substrate includes a main portion and a bending portion connected to the main portion. The first barrier wall is located at the main portion. In a case where the at least one organic layer in the organic structure includes multiple organic layers, the multiple organic layers include: at least one first organic layer and at least one second organic layer located on a side of the at least one first organic layer away from the substrate. The at least one first organic layer is located at the main portion and the bending portion, and the at least one second organic layer is located at at least the bending portion.

In some embodiments, the display substrate further includes: at least one planarization layer provided on the first side of the substrate, and a pixel defining layer provided on a side of the at least one planarization layer away from the substrate; a first organic layer in the at least one first organic layer and a planarization layer in the at least one planarization layer are provided in a same layer, and a second organic layer in the at least one second organic layer and the pixel defining layer are provided in another same layer.

In some embodiments, the display panel is in a shape of an approximate rectangle; the display panel includes a first side edge, a second side edge, a third side edge and a fourth side edge, and the fourth side edge is provided in correspondence with the bending portion and opposite to the second side edge; and in a case where the organic structure includes one first organic layer and at least one second organic layer, the first organic layer is located within a region corresponding to the first side edge, the second side edge, the third side edge and the fourth side edge, and the at least one second organic layer is located within a region corresponding to the fourth side edge.

In some embodiments, the display substrate further includes multiple first inorganic insulating layers provided on the first side of the substrate, and the multiple first inorganic insulating layers include at least a gate dielectric layer and an interlayer dielectric layer; the first barrier wall and the organic structure are both located on a side of the multiple first inorganic insulating layers away from the substrate; and the inorganic encapsulation layer is in contact with a portion, located between the first barrier wall and the organic structure, of the multiple first inorganic insulating layers.

In some embodiments, the inorganic dielectric layer includes an inorganic barrier layer and a second inorganic insulating layer stacked in sequence. The touch function layer further includes: a first touch electrode layer, a second touch electrode layer and a protective layer. The first touch electrode layer is provided between the inorganic barrier layer and the second inorganic insulating layer. The second touch electrode layer is provided on a side of the second inorganic insulating layer away from the inorganic barrier layer, and the first touch electrode layer and the second touch electrode layer are located in the display area. The protective layer is provided on a side of the second touch electrode layer away from the inorganic barrier layer, and the protective layer covers at least a portion of the organic structure.

In some embodiments, the display substrate further includes at least one second barrier wall provided between the display area and the first barrier wall, and the second barrier wall surrounds the display area.

In another aspect, a display apparatus is provided, including: the display panel as described in any of the above embodiments.

In yet another aspect, a display panel is provided. The display panel has a display area and a peripheral area. The display panel includes: a display substrate and a touch function layer. The display substrate includes: a substrate, a first barrier wall, an organic structure, and a film encapsulation layer. The first barrier wall is provided on a first side of the substrate, and the first barrier wall is located in the peripheral area and surrounds the display area. The organic structure is provided on the first side of the substrate and surrounding the first barrier wall, and the organic structure includes at least one organic layer. The film encapsulation layer is provided on a side of the first barrier wall away from the substrate, an inorganic encapsulation layer in the film encapsulation layer covers the first barrier wall, and an orthographic projection of the inorganic encapsulation layer on the substrate partially overlaps with an orthographic projection of the organic structure on the substrate. The touch function layer is provided on a side of the film encapsulation layer away from the substrate, and the touch function layer includes an inorganic dielectric layer in contact with the film encapsulation layer; and the orthographic projection of the inorganic encapsulation layer on the substrate is located within a range of an orthographic projection of the inorganic dielectric layer on the substrate, or the orthographic projection of the inorganic encapsulation layer on the substrate coincides with the orthographic projection of the inorganic dielectric layer on the substrate.

In some embodiments, an area of the orthographic projection of the inorganic encapsulation layer on the substrate is less than or equal to an area of the orthographic projection of the inorganic dielectric layer on the substrate.

In some embodiments, at least a portion of a boundary of the inorganic encapsulation layer is flush with at least a portion of a boundary of the inorganic dielectric layer.

In some embodiments, the inorganic dielectric layer covers at least a portion of the boundary of the inorganic encapsulation layer.

In some embodiments, the inorganic dielectric layer includes an inorganic barrier layer and a second inorganic insulating layer stacked in sequence. The touch function layer further includes: a first touch electrode layer, a second touch electrode layer and a protective layer. The first touch electrode layer is provided between the inorganic barrier layer and the second inorganic insulating layer. The second touch electrode layer is provided on a side of the second inorganic insulating layer away from the inorganic barrier layer, and the first touch electrode layer and the second touch electrode layer are located in the display area. The protective layer is provided on a side of the second touch electrode layer away from the inorganic barrier layer, and the protective layer covers a boundary of the inorganic dielectric layer.

In some embodiments, the substrate includes a main portion and a bending portion connected to the main portion. The first barrier wall is located at the main portion. In a case where the at least one organic layer in the organic structure includes multiple organic layers, the multiple organic layers include: at least one first organic layer and at least one second organic layer located on a side of the at least one first organic layer away from the substrate. The at least one first organic layer is located at the main portion and the bending portion, and the at least one second organic layer is located at at least the bending portion.

In some embodiments, the display substrate further includes: at least one planarization layer provided on the first side of the substrate, and a pixel defining layer provided on a side of the planarization layer away from the substrate. A first organic layer in the at least one first organic layer and a planarization layer in the at least one planarization layer are provided in a same layer, and a second organic layer in the at least one second organic layer and the pixel defining layer are provided in a same layer.

In some embodiments, the display panel is in a shape of an approximate rectangle. The display panel includes a first side edge, a second side edge, a third side edge and a fourth side edge, and the fourth side edge is provided in correspondence with the bending portion and opposite to the second side edge. In a case where the organic structure includes one first organic layer and at least one second organic layer, the first organic layer is located within a region corresponding to the first side edge, the second side edge, the third side edge and the fourth side edge, and the at least one second organic layer is located within a region corresponding to the fourth side edge.

In some embodiments, the touch function layer further includes an anti-crack structure, and the anti-crack structure is provided in a same layer as the first touch electrode layer; and the anti-crack structure is located at the bending portion, and an orthographic projection of the anti-crack structure on the substrate is located within a range of an orthographic projection of the second inorganic insulating layer on the substrate.

In some embodiments, the orthographic projection of the anti-crack structure on the substrate is non-overlapping with an orthographic projection of the first barrier wall on the substrate are; and/or the orthographic projection of the anti-crack structure on the substrate partially overlaps with the orthographic projection of the organic structure on the substrate.

In some embodiments, a distance between an outer boundary of an orthographic projection of the first barrier wall on the substrate and a boundary of the orthographic projection of the inorganic encapsulation layer on the substrate ranges from: 80 μm to 130 μm.

In some embodiments, the display substrate further includes multiple first inorganic insulating layers provided on the first side of the substrate, and the multiple first inorganic insulating layers include at least a gate dielectric layer and an interlayer dielectric layer; the first barrier wall and the organic structure are both located on a side of the multiple first inorganic insulating layers away from the substrate; and the inorganic encapsulation layer is in contact with a portion, located between the first barrier wall and the organic structure, of the multiple first inorganic insulating layers.

In some embodiments, an orthographic projection of the gate dielectric layer on the substrate is located within a range of an orthographic projection of a protective layer in the touch function layer on the substrate, and a distance between a boundary of the orthographic projection of the protective layer on the substrate and a boundary of the orthographic projection of the gate dielectric layer on the substrate ranges from: 5 μm to 15 μm; and/or an orthographic projection of the interlayer dielectric layer on the substrate is located within a range of the orthographic projection of the inorganic dielectric layer on the substrate, and a distance between a boundary of the orthographic projection of the inorganic dielectric layer on the substrate and a boundary of the orthographic projection of the interlayer dielectric layer on the substrate ranges from: 5 μm to 15 μm.

In some embodiments, the display substrate further includes at least one second barrier wall provided between the display area and the first barrier wall, and the second barrier wall surrounds the display area.

In yet another aspect, a display apparatus is provided, including: the display panel as described in any of the above embodiments.

BRIEF DESCRIPTION OF THE DRAWINGS

In order to describe technical solutions in the present disclosure more clearly, the accompanying drawings to be used in some embodiments of the present disclosure will be introduced briefly; obviously, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, and are not limitations on an actual size of a product to which the embodiments of the present disclosure relate.

DESCRIPTION OF THE INVENTION

Figure 1:
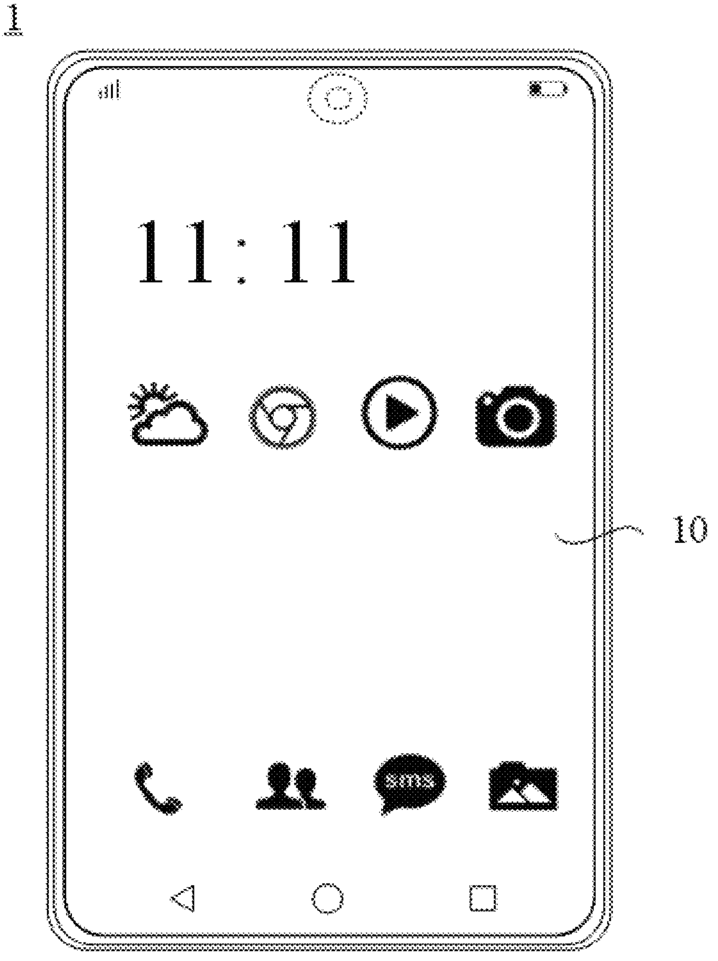
FIG. 1 is a structural diagram of a display apparatus, in accordance with some embodiments of the present disclosure.

The technical solutions in embodiments of the present disclosure will be described clearly and completely with reference to the accompanying drawings. Obviously, the described embodiments are merely some but not all of embodiments of the present disclosure. All other embodiments obtained on the basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials, or characteristics described herein may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, the features defined with "first" and "second" may explicitly or implicitly include one or more of the features. In the description of the embodiments of the present disclosure, the term "a plurality of/the plurality of" means two or more unless otherwise specified.

Some embodiments may be described using the term "connected" and its derivatives. For example, the term "connected" may be used in the description of some embodiments to indicate that two or more components are in direct physical or electrical contact with each other. The embodiments disclosed herein are not necessarily limited to the content herein.

The phrase "A and/or B" includes the following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phrase "applicable to" or "configured to" used herein means an open and inclusive expression, which does not exclude devices that are applicable to or configured to perform additional tasks or steps.

In addition, the phrase "based on" used is meant to be open and inclusive, since processes, steps, calculations or other actions "based on" one or more of the stated conditions or values may, in practice, be based on additional conditions or values exceeding those stated.

The term such as "about", "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

The term such as "perpendicular" or "equal" as used herein includes a stated case and a case similar to the stated case within an acceptable range of deviation determined by a person of ordinary skill in the art, considering measurement in question and errors associated with measurement of a particular quantity (i.e., limitations of a measurement system). For example, the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of approximate equality may be, for example, that a difference between two equals is less than or equal to 5% of any one of the two equals.

It will be understood that, in a case where a layer or an element is referred to as being on another layer or a substrate, it may be that the layer or the element is directly on the another layer or the substrate, or there may be a middle layer between the layer or the element and the another layer or the substrate.

Exemplary embodiments are described herein with reference to sectional views and/or plan views as idealized exemplary drawings. In the drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display panel 10 and a display apparatus 1. The display panel 10 and the display apparatus 1 are described below, respectively.

The display apparatus provided in the embodiments of the present disclosure may be any apparatus that can display an image whether in motion (e.g., video) or stationary (e.g., a still image), and whether textual or pictorial. More specifically, it is expected that the embodiments may be implemented in or associated with various electronic devices. The various electronic devices may include (but are not limit to), for example, mobile telephones, wireless devices, personal data assistants (PAD), hand-held or portable computers, GPS receivers/navigators, cameras, MP4 video players, video cameras, game consoles, watches, clocks, calculators, television monitors, flat panel displays, computer monitors, car displays (e.g., odometer displays, etc.), navigators, cockpit controllers and/or displays, displays with camera view (such as displays with rear view camera in vehicles), electronic photos, electronic billboards or indicators, projectors, building structures, packagings and aesthetic structures (such as a display for an image of a piece of jewelry), etc.

For example, the display apparatus 1 may be any product or component having touch and display functions.

In some embodiments, as shown in FIG. 1, the display apparatus 1 includes a display panel 10.

For example, the display apparatus 1 further includes: a driver chip, a housing, etc.

For example, the driver chip can provide various signals to the display panel 10, so the display panel 10 can implement functions such as display and touch based on the various drive signals provided by the driver chip.

For example, the housing can support and protect the entire display apparatus 1.

Figure 2:
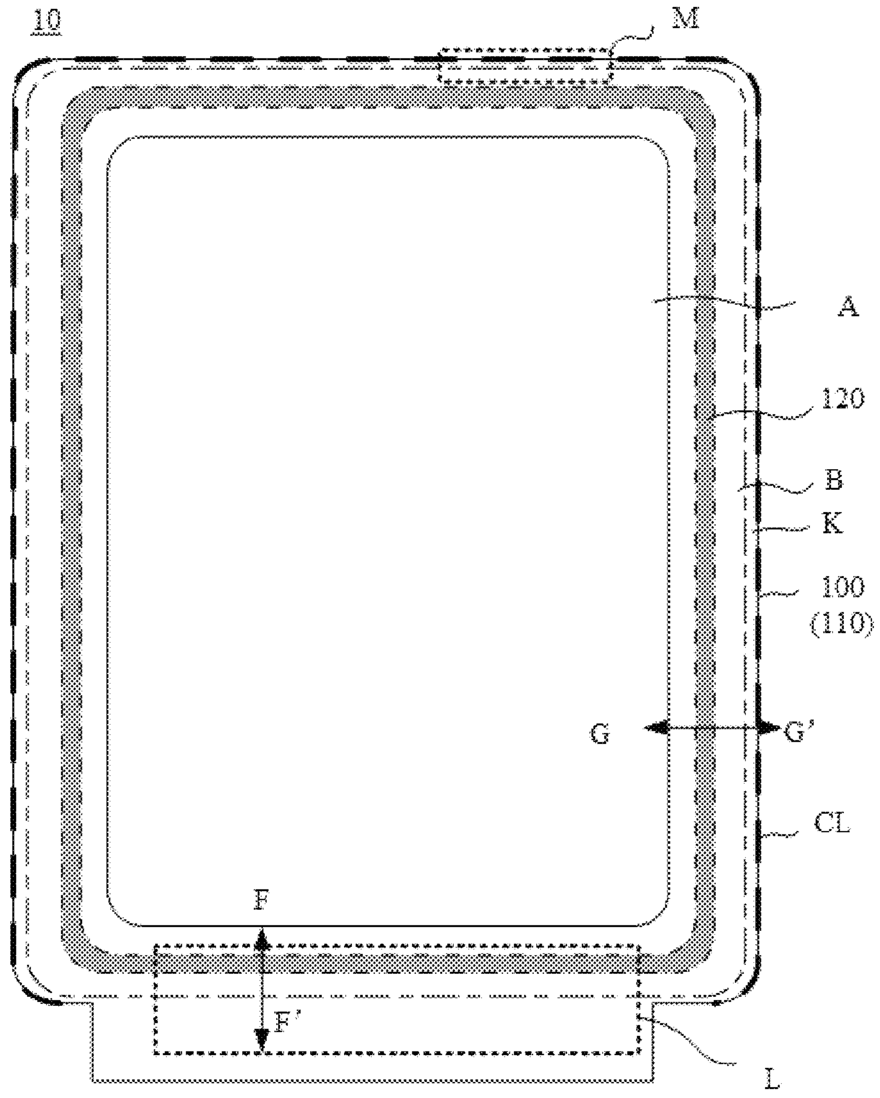
FIG. 2 is a structural diagram of a display panel, in accordance with some embodiments of the present disclosure.

In some examples, as shown in FIG. 2, the display panel 10 has a display area A and a peripheral area B.

For example, the display area A can be used to implement screen display and touch functions.

For example, the peripheral area B can be used to arrange various signal lines transmitting signals for the display area A and various circuit structures (such as shift registers).

For example, the peripheral area B may surround a portion of the display area A. That is, the peripheral area B may be located at one side, two sides, or three sides of the display area A. As another example, as shown in FIG. 2, the peripheral area B may surround the display area A, enclosing the display area A.

The shape of the display area A may vary, which may be set according to actual needs.

For example, the display area A may be in a shape of a rectangle, an approximate rectangle, a circle or an ellipse. Here, the approximate rectangle is a rectangle in a non-strict sense, for example, its four inner corners may be rounded corners, or a certain side may not be a straight line.

In some embodiments, as shown in FIG. 2, the display panel 10 includes a display substrate 100.

Here, the display substrate 100 has a light-exit side, which refers to a side on which the display substrate 100 displays images.

Figure 3A:
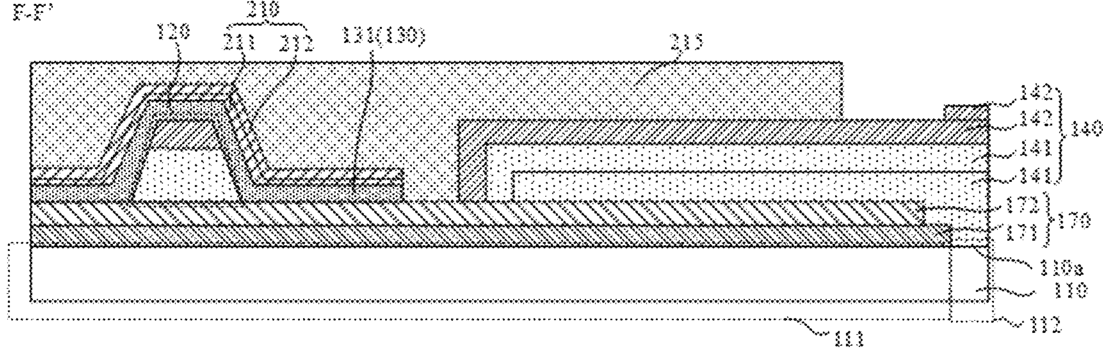
FIG. 3*a* is a sectional view of the display panel shown in FIG. 2 taken along the line F-F'.

For example, as shown in FIG. 3*a*, the display substrate 100 includes a substrate 110.

For example, the substrate 110 may be a flexible substrate or a rigid substrate.

For example, in a case where the substrate 110 is a flexible substrate, the substrate 110 may be made of highly elastic materials, such as dimethylsiloxane, polyimide (PI), and polyethylene terephthalate (PET). As another example, in a case where the substrate 110 is a rigid substrate, the material of the substrate 110 may be glass.

For example, as shown in FIG. 3*a*, the substrate 110 is of a plate-shaped structure, and the plate-shaped structure has a first side 110*a* used to allow various function devices to be arranged thereon.

Figure 4:
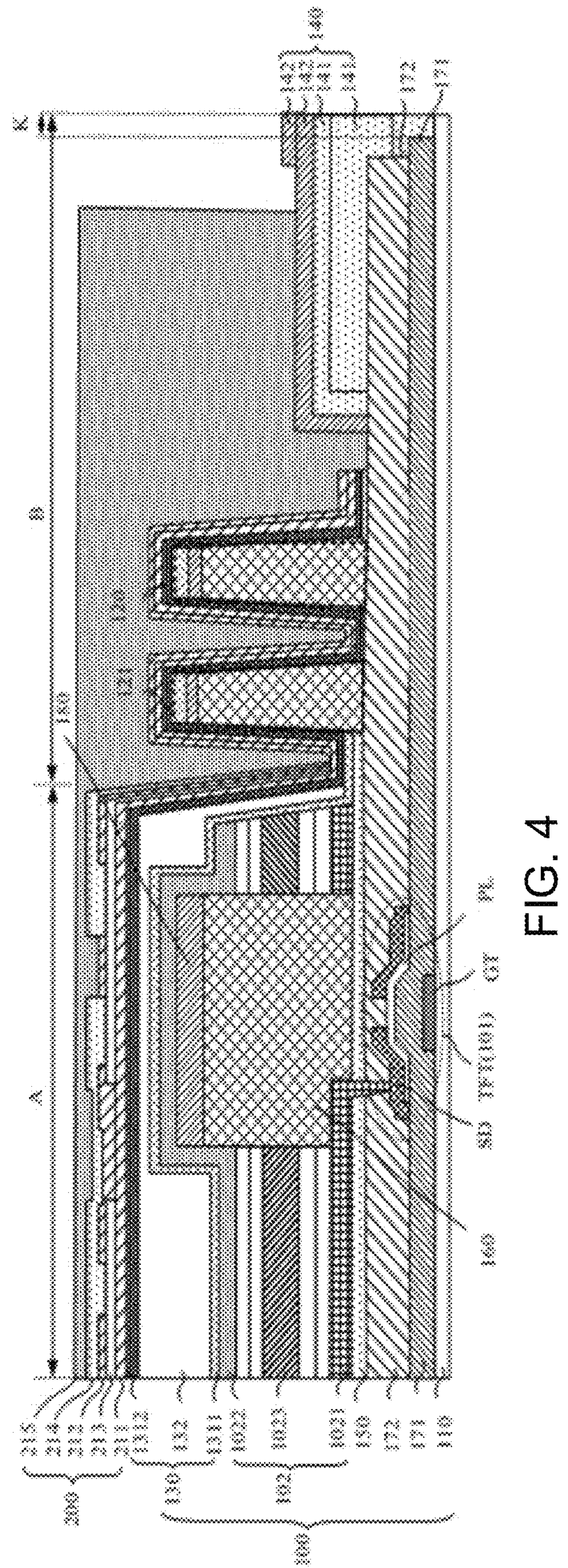
FIG. 4 is a structural diagram of another display panel, in accordance with some embodiments of the present disclosure.

In some examples, as shown in FIG. 4, the display substrate 100 further includes: a pixel driving circuit layer and a light-emitting device layer arranged on the first side 110*a* of the substrate 110 in sequence.

For example, the pixel driving circuit layer includes a plurality of pixel driving circuits 101.

For example, the plurality of pixel driving circuits 101 may be located in the display area A; alternatively, a portion of the plurality of pixel driving circuits 101 may be located in the display area A, and the other portion may be located in the peripheral area B.

For example, the pixel driving circuits 101 may be arranged in an array.

For example, a pixel driving circuit 101 is generally composed of electronic devices such as a thin film transistor (TFT), and a capacitor. For example, a pixel driving circuit may be of 3T1C structure composed of three thin film transistors (including two switching TFTs and one driving TFT) and one capacitor C. Of course, a pixel driving circuit may include more than three transistors (e.g., including multiple switching TFTs and at least one driving TFT) and at least one capacitor. The switching TFT and the driving TFT in the pixel driving circuit 101 may be formed synchronously.

For example, as shown in FIG. 4, the pixel driving circuit layer includes at least one active layer PL, at least one gate conductive layer GT, and at least one source-drain conductive layer SD, which are stacked in sequence. The above-mentioned TFT is generally composed of an active pattern located in an active layer PL, a gate pattern located in a gate conductive layer GT, and a source-drain pattern located in a source-drain conductive layer SD.

For example, as shown in FIG. 4, the light-emitting device layer 4 includes a plurality of light-emitting devices 102. The plurality of light-emitting devices 102 may be located in the display area A.

For example, the light-emitting devices 102 may be organic light-emitting diodes (OLEDs).

For example, as shown in FIG. 4, a light-emitting device 102 includes a first electrode 1021, a second electrode 1022, and a light-emitting function layer 1023 provided between the first electrode 1021 and the second electrode 1022, in which the light-emitting function layer 1023 includes a light-emitting layer. Optionally, the light-emitting function layer 1023 may further include at least one of a hole injection layer, a hole transport layer, an electron transport layer, and an electron injection layer.

For example, the first electrode 1021 may be one of an anode and a cathode, and the second electrode 1022 may be the other of the anode and the cathode, and the present disclosure is not limited thereto.

For example, the pixel driving circuit 101 and the plurality of light-emitting devices 102 described above may be coupled in one-to-one correspondence. As another example, one pixel driving circuit 101 may be coupled to multiple light-emitting devices 102; alternatively, multiple pixel driving circuits 101 may be coupled to one light-emitting device 102.

Hereinafter, the present disclosure schematically illustrates the structure of the display substrate 100, taking the first electrode 1021 as an anode, the second electrode 1022 as a cathode, and one pixel driving circuit 101 coupled to one light-emitting device 102 as an example.

For example, in the display panel 10, each pixel driving circuit 101 can generate a driving signal. Each light-emitting device 102 can emit light due to the driving action of a driving signal generated by a pixel driving circuit 101 corresponding thereto. The light emitted by the plurality of light-emitting devices 102 cooperates with each other, so that the display panel 10 and the display apparatus 1 realize the display function.

For example, the display panel 10 may be of a single-layer source-drain conductive layer structure, i.e., film layers of the display substrate 100 are provided therein with a structure of a single source-drain conductive layer (source electrode/drain electrode, referred to as a single SD); alternatively, the display panel 10 may be of a double-layer source-drain conductive layer structure, i.e., film layers of the display substrate 100 are provided therein with a structure of two source-drain conductive layers (referred to as a double SD).

In some examples, as shown in FIG. 3*a*, the display substrate 100 further includes a first barrier wall 120.

For example, the first barrier wall 120 is provided on the first side 110*a* of the above-described substrate 110.

Figure 3B:
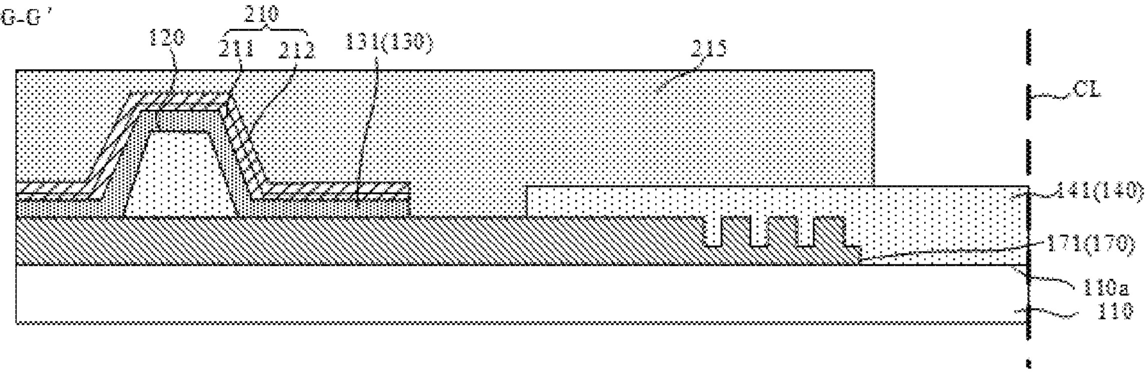
FIG. 3*b* is a sectional view of the display panel shown in FIG. 2 taken along the line G-G'.

For example, from the sectional view shown in FIG. 3*b*, the first barrier wall 120 may be of a columnar structure, where the columnar structure is trapezoidal and has a certain height.

For example, as shown in FIGS. 2 and 3*a*, the above-mentioned first barrier wall 120 is located in the peripheral area B and surrounds the display area A.

For example, from the top view shown in FIG. 2, the first barrier wall 120 may be an annular structure and arranged around the display area A. In some examples, as shown in FIGS. 3*a* and 4, the display substrate 100 further includes a film encapsulation layer 130.

For example, the film encapsulation layer 130 is provided on a side of the first barrier wall 120 away from the substrate 110.

For example, the film encapsulation layer 130 is located in the display area A and the peripheral area B of the display substrate 100.

For example, the film encapsulation layer 130 can encapsulate the above-mentioned pixel driving circuits 101 and the light-emitting devices 102, so that the pixel driving circuits 101 and the light-emitting devices 102 are isolated from external water vapor, thereby improving the light-emitting performance and light-emitting life of the light-emitting devices 102, to avoid oxidation of the pixel driving circuits 101 and the light-emitting devices 102 by water vapor in the event of water vapor intrusion.

For example, as shown in FIG. 4, the film encapsulation layer 130 includes inorganic encapsulation layer(s) 131 and an organic encapsulation layer 132. For example, the inorganic encapsulation layer(s) 131 may include a first inorganic encapsulation layer 1311 and a second inorganic encapsulation layer 1312. The organic encapsulation layer may be located between the first inorganic encapsulation layer 1311 and the second inorganic encapsulation layer 1312.

For example, the inorganic encapsulation layer 131 may be formed through a vapor deposition process by using an inorganic material; and the organic encapsulation layer 132 may be formed through an inkjet printing process by using an organic material.

It can be understood that the organic encapsulation layer 132 is mainly used for planarization and stress relief, and the first inorganic encapsulation layer 1311 and the second inorganic encapsulation layer 1312 in the inorganic encapsulation layers 131 are mainly used for blocking water/oxygen and enclosing the organic encapsulation layer 132 located between the first inorganic encapsulation layer 1311 and the second inorganic encapsulation layer 1312. Since the first barrier wall 120 has a certain height, the first barrier wall 120 can be used to block the material of the organic encapsulation layer 132, so that the organic encapsulation layer 132 is within a region surrounded by the first barrier wall 120, and there is no organic encapsulation layer 132 outside the region surrounded by the first barrier wall 120.

For example, as shown in FIG. 3*a*, the inorganic encapsulation layer 131 covers the first barrier wall 120 and extends toward the peripheral area B.

For example, both the side surfaces and the top surface of the first barrier wall 120 are in contact with the inorganic encapsulation layer 131.

In some examples, as shown in FIG. 3*a*, the display substrate 100 further includes an organic structure 140. For example, the organic structure 140, the first barrier wall 120 and the film encapsulation layer 130 are all located on the first side 110*a* of the substrate 110.

For example, the organic structure 140 is located on a side of the first barrier wall 120 away from the display area A. The organic structure 140 is arranged around the first barrier wall 120.

For example, as shown in FIG. 2, the peripheral area B of the display panel 10 further includes a bending region K.

For example, the bending region K is located at the edge of the peripheral area B away from the display area A.

It can be understood that during the manufacturing process of the display panel 10, a portion of the display panel 10 located in the bending region K may be bent to achieve a curved screen design or a narrow bezel design of the display panel 10.

The organic structure 140 may be located in peripheral area B. And further, a portion of the organic structure 140 may be located in the bending region K.

For example, the organic structure 140 includes at least one organic layer. The organic layer is made of an organic material having a certain degree of flexibility. For example, the material of at least one organic layer is polyimide (PI).

For example, the organic structure 140 may include a single organic layer. Therefore, the thickness of the peripheral area B of the display panel 10 can be made smaller, which is beneficial to the thinner and lighter design of the display panel 10. As another example, the organic structure 140 may include multiple organic layers stacked in sequence. The multiple organic layers may increase the flexibility of the peripheral area B of the display panel 10, thereby buffering the external impact of the peripheral area B of the display panel 10.

In some examples, in different regions of the peripheral area B, the number of organic layers included in the organic structure 140 may be different or the same, which may be set according to the actual situation, and the present disclosure is not limited thereto.

For example, in conjunction with FIGS. 2, 3*a*, and 3*b*, a portion of the organic structure 140 is located in regions of the peripheral area B located on the left, right, and upper sides of the display area A of the display panel 10, and this portion may include a single organic layer; and a portion of the organic structure 140 is located in a region of the peripheral area B located on the lower side of the display area A of the display panel 10, and this portion may include multiple organic layers, for example, including three or four organic layers.

Figure 6A:
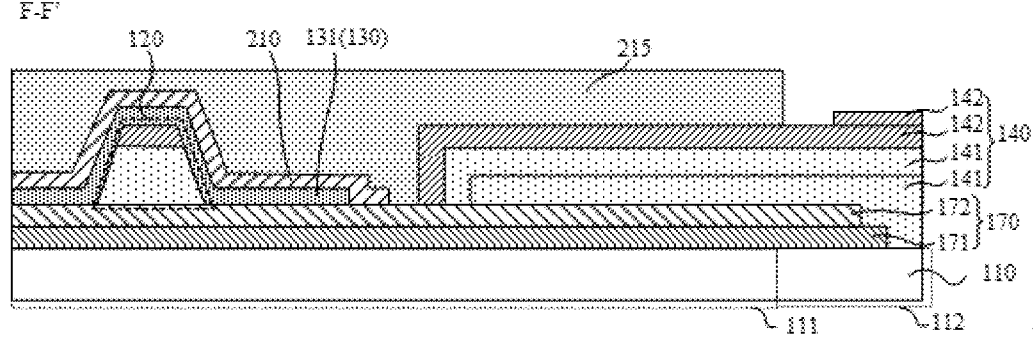
FIG. 6*a* is another sectional view of the display panel shown in FIG. 2 taken along the line F-F'.
Figure 6B:
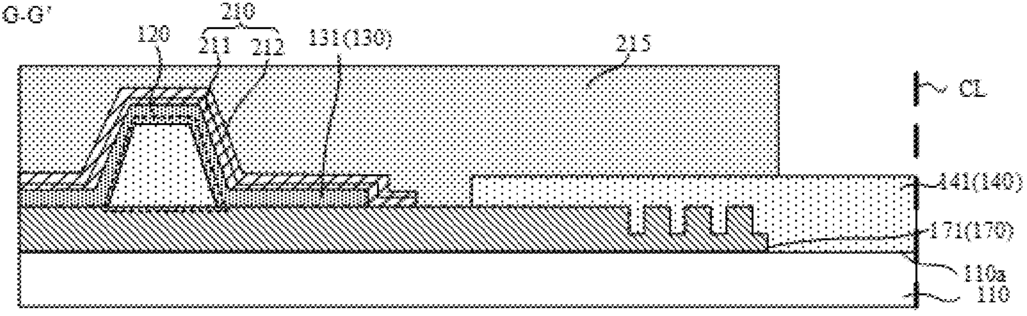
FIG. 6*b* is another sectional view of the display panel shown in FIG. 2 taken along the line G-G'.

It will be noted that in FIGS. 2, 3*b*, and 6*b*, a bold dashed line is used to illustrate a cutting line CL. The cutting line CL is a cutting position for cutting a display motherboard into multiple display panels 10. In the process of cutting the display motherboard to form the display panels 10, the organic structure 140 is provided on a side of the cutting line CL, thereby reducing the risk of stress and cracks at the edges of the display panels 10 caused by the cutting, and thereby improving the quality of the display substrate 100. In addition, in the process of bending the portion of the display panel 10 located in the bending region, the provision of the organic structure 140 further prevents cracks from appearing on the edges of the display panel 10, or avoids further spreading of cracks if cracks appear, and thus improves the quality of the display substrate 100.

In some examples, as shown in FIG. 4, the display panel 10 further includes: a touch function layer 200 provided on a light-exit side of the display substrate 100. The touch function layer 200 is used to realize a touch function of the display panel 10.

Here, the light-exit side of the display substrate 100 refers to a side of the display substrate that displays images. For example, a light-exit direction of the display substrate 100 points from the substrate 110 to the light-emitting devices 102.

For example, the touch function layer 200 is provided on a side of the film encapsulation layer 130 away from the substrate 110.

For example, the touch function layer 200 may be of a flexible multi-layer structure (flexible multiple layers on cell, FMLOC for short).

In some examples, as shown in FIG. 3*a*, the above-described touch function layer 200 includes an inorganic dielectric layer 210 provided in contact with the above-described film encapsulation layer 130.

For example, the above-described inorganic dielectric layer 210 covers the first barrier wall 120.

For example, an orthographic projection of the first barrier wall 120 on the substrate 110 is located within a range of an orthographic projection of the inorganic dielectric layer 210 on the substrate 110.

For example, the top surface and side surfaces of the first barrier wall 120 are covered with the inorganic dielectric layer 210. Since the inorganic encapsulation layer 131 also covers the first barrier wall 120, the inorganic dielectric layer 210 covers the top of the inorganic encapsulating layer 131 and has an undulating shape along with an outer contour of the first barrier wall 120.

Figure 3C:
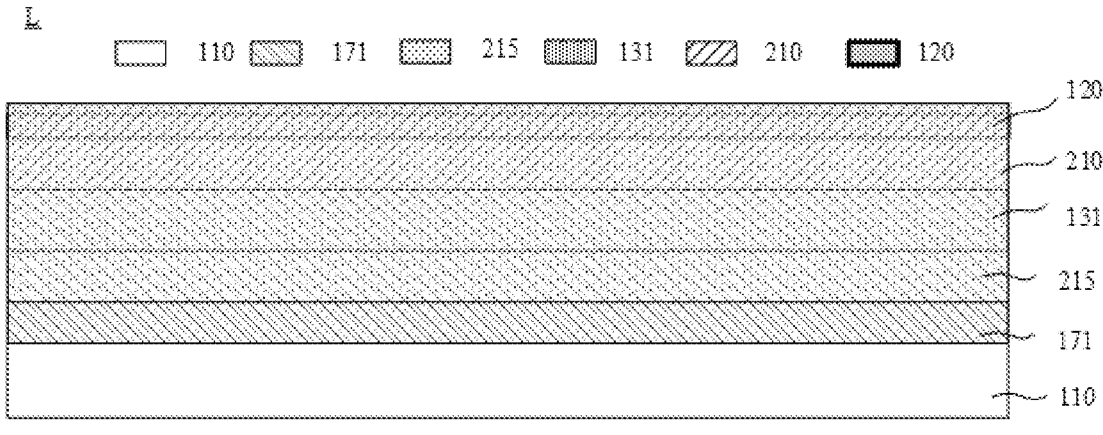
FIG. 3*c* is a partial enlarged view of some film layers in the L region of the display panel shown in FIG. 2.

FIG. 3*c* is a partial enlarged view of some film layers in the L region of the display panel 10 shown in FIG. 2, and illustrates the relationship between boundaries of some film layers in the display panel 10.

Figure 5A:
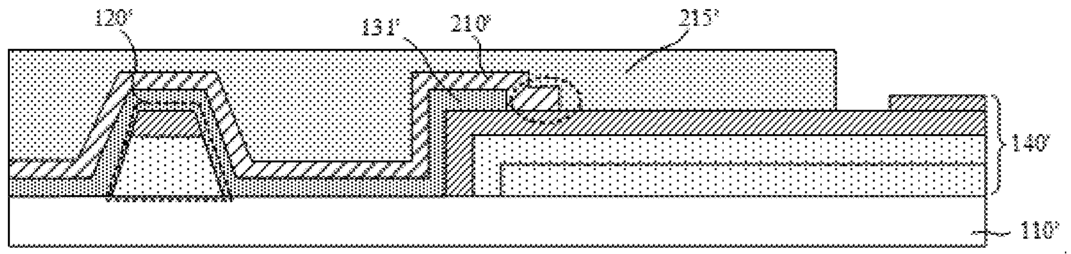
FIG. 5*a* is a structural diagram of a display panel in one implementation.
Figure 5B:
FIG. 5*b* is a schematic diagram of cracks in a display panel in one implementation.

In one implementation, as shown in FIG. 5*a*, an orthographic projection of an inorganic encapsulation layer 131' in a display panel on a substrate 110' overlaps with an orthographic projection of an organic structure 140' on the substrate 110', an orthographic projection of an inorganic dielectric layer 210' in the display panel on the substrate 110' overlaps with the orthographic projection of the organic structure 140' on the substrate 110', and the inorganic dielectric layer 210' covers the inorganic encapsulation layer 131'. That is to say, the edges of the inorganic dielectric layer 210' are in contact with the organic structure 140', and the edges of the inorganic encapsulation layer 131' are in contact with the organic structure 140'. Since the organic structure 140' is made of an organic material, and the inorganic encapsulation layer 131' and the inorganic dielectric layer 210' are both made of inorganic materials, the bonding force of an interface at which the organic material is in contact with the inorganic material is poor. In the preparation process of a touch function layer 200', the display panel needs to be cleaned by a water process, which makes water vapor easy to enter from the interface between the inorganic dielectric layer 210' and the organic structure 140' (at the position of the dotted circle in FIG. 5*a*), making the inorganic dielectric layer 210' be easily peeled off from the organic structure 140'. Furthermore, in a case where peeling of the inorganic dielectric layer 210' occurs, water vapor is prone to continue to intrude into the contact interface between the inorganic encapsulation layer 131' and the organic structure 140' and the contact interface between the inorganic dielectric layer 210' and the inorganic encapsulation layer 131'. Since the bonding force of an interface between the inorganic dielectric layer 210' and the inorganic encapsulation layer 131' is greater than the bonding force of an interface between the inorganic encapsulation layer 131' and the organic structure 140', which in turn is likely to cause the inorganic dielectric layer 210' to drive the inorganic encapsulation layer 131' to move, so that peeling also occurs between the inorganic encapsulation layer 131' and the organic structure 140' (e.g., at the position of the dotted circle in FIG. 5*b*). Therefore, the above two peeling problems are not only prone to cause the touch function layer to fall off, but also prone to make water vapor invade into the light-emitting devices in the display substrate, thereby reducing the light-emitting performance and light-emitting life of the light-emitting devices, thereby prone to reduce the yield rate of the display panel and the display device, and to increase the production cost of the display panel and the display apparatus.

In light of this, in the display panel 10 provided by some embodiments of the present disclosure, as shown in FIGS. 3*a*, 3*b*, 4 and 6*a*, an orthographic projection of the inorganic encapsulation layer 131 on the substrate 110 is non-overlapping with an orthographic projection of the organic structure 140 on the substrate 110, and an orthographic projection of the inorganic dielectric layer 210 on the substrate 110 is non-overlapping with the orthographic projection of the organic structure 140 on the substrate 110.

For example, as shown in FIG. 3*a*, the inorganic dielectric layer 210, the inorganic encapsulation layer 131, and the organic structure 140 are all provided on the first side 110*a* of the substrate 110.

For example, the thickness of the inorganic dielectric layer 210 and the thickness of the inorganic encapsulation layer 131 are both less than the thickness of the organic structure 140.

For example, the sum of the thickness of the inorganic dielectric layer 210 and the thickness of the inorganic encapsulation layer 131 is less than the thickness of the organic structure 140.

As a result, it may be avoided that the inorganic encapsulation layer 131 is made to lap on the top surface of the organic structure 140 after rising along a side surface of the organic structure 140, which in turn can reduce the risk of cracks in the inorganic encapsulation layer 131 at the positions corresponding to the side and the top surfaces of the organic structure 140, and thus water vapor intrusion may be further avoided, which may effectively improve encapsulation effect.

Figure 3D:
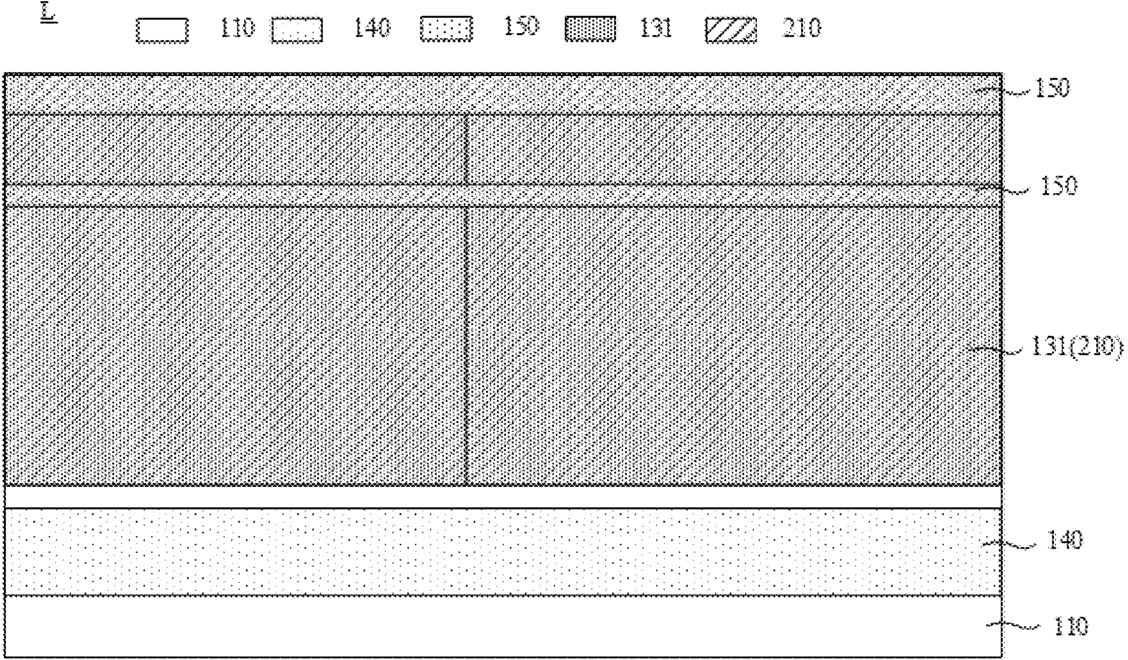
FIG. 3*d* is a partial enlarged view of some other film layers in the L region of the display panel shown in FIG. 2.

In some examples, as shown in FIG. 3*d*, there is a certain distance between a boundary line of the orthographic projection of the inorganic encapsulation layer 131 on the substrate 110 and a boundary line of the orthographic projection of the organic structure 140 on the substrate 110, and there is no crossover between the two. The inorganic encapsulation layer 131 has no contact with the organic structure 140. There is a certain distance between a boundary line of the orthographic projection of the inorganic dielectric layer 210 on the substrate 110 and the boundary line of the orthographic projection of the organic structure 140 on the substrate 110. The inorganic dielectric layer 210 has no contact with the organic structure 140.

By using the above-described setting method, the inorganic encapsulation layer 131 and the organic structure 140 do not overlap, and the inorganic dielectric layer 210 and the organic structure 140 do not overlap. In this way, during the water process, water vapor does not invade from a surface of the organic structure 140 away from the substrate 110 into the inorganic dielectric layer 210 and channels within the inorganic encapsulation layer 131, thereby reducing the risk of peeling of the inorganic dielectric layer 210 and the inorganic encapsulation layer 131. The edge of the inorganic dielectric layer 210 is set to have a certain distance from the organic structure 140, so that in the process of adopting the water process, water vapor may be avoided from entering the interface between the inorganic dielectric layer 210 and the organic structure 140, and thus the peeling between the inorganic dielectric layer 210 and the organic structure 140 may be avoided, and thus the risk of the touch function layer 200 being peeled off from the display substrate 100 may be reduced. In this way, the yield rate of the display panel 10 and the display apparatus 1 may be improved, and the production cost of the display panel 10 and the display apparatus 1 may be reduced. The inorganic encapsulation layer 131 is set to have a certain distance from the organic structure 140, so that in the process of adopting the water process, water vapor may be avoided from entering from the interface between the inorganic encapsulation layer 131 and the organic structure 140, which in turn may avoid peeling off between the inorganic encapsulation layer 131 and the organic structure 140. In this way, the encapsulation effect of the inorganic encapsulation layer 131 may be improved, and the light-emitting performance and light-emitting life of the light-emitting devices 102 may be improved. In addition, in a case where the inorganic dielectric layer 210 is peeled off, the problem of the inorganic dielectric layer 210 driving the inorganic encapsulation layer 131 to move, which causes the inorganic encapsulation layer 131 to be peeled off from the organic structure 140, may be avoided, which may further avoid the intrusion of water vapor at the peeled-off location into the interior of the display substrate 100, and thus may effectively improve the yield rate of the display panel 10 and the display apparatus 1.

It will be noted that in the display substrate 100, the inorganic encapsulation layer 131 and the inorganic dielectric layer 210 have various structural features and relative positional relationships, which may be set according to the actual situation, and the present disclosure does not limit this.

In some embodiments, as shown in FIGS. 3*a* and 6*a*, the area of the orthographic projection of the inorganic encapsulation layer 131 on the substrate 110 is less than or equal to the area of the orthographic projection of the inorganic dielectric layer 210 on the substrate 110.

In some examples, the area of the orthographic projection of the inorganic encapsulation layer 131 on the substrate 110 is equal to the area of the orthographic projection of the inorganic dielectric layer 210 on the substrate 110.

For example, the area of a portion of the substrate 110 covered by the inorganic encapsulation layer 131 is the same as the area of a portion of the substrate 110 covered by the inorganic dielectric layer 210.

For example, a boundary of the orthographic projection of the inorganic encapsulation layer 131 on the substrate 110 may coincide with a boundary of the orthographic projection of the inorganic dielectric layer 210 on the substrate 110.

As another example, the boundary of the orthographic projection of the inorganic encapsulation layer 131 on the substrate 110 and the boundary of the orthographic projection of the inorganic dielectric layer 210 on the substrate 110 may also intersect.

In some other examples, as shown in FIG. 6*a*, the area of the orthographic projection of the inorganic encapsulation layer 131 on the substrate 110 is less than the area of the orthographic projection of the inorganic dielectric layer 210 on the substrate 110.

For example, the area of a portion of the substrate 110 covered by the inorganic encapsulation layer 131 is less than the area of a portion of the substrate 110 covered by the inorganic dielectric layer 210.

For example, the entire boundary line of the orthographic projection of the inorganic encapsulation layer 131 on the substrate 110 may be located within the boundary line of the orthographic projection of the inorganic dielectric layer 210 on the substrate 110.

As another example, the boundary line of the orthographic projection of the inorganic encapsulation layer 131 on the substrate 110 and the boundary line of the orthographic projection of the inorganic dielectric layer 210 on the substrate 110 may also intersect.

By using the above-described setting method, the inorganic dielectric layer 210 can have a large area, ensuring a large contact area of the inorganic dielectric layer 210 and the inorganic encapsulation layer 131, thereby ensuring a large interface bonding force of the two. Moreover, water vapor may be prevented from intruding from the interface between the inorganic dielectric layer 210 and the organic structure 140 during the water process, and the touch function layer 200 may be prevented from being peeled off from the display substrate 100, thereby improving the yield rate of the display panel 10 and the display apparatus 1, reducing the production cost of the display panel 10 and the display apparatus 1.

In some examples, as shown in FIG. 3*a*, at least a portion of the boundary of the inorganic encapsulation layer 131 is flush with at least a portion of the boundary of the inorganic dielectric layer 210. That is to say, the boundary line of the orthographic projection of the inorganic encapsulation layer 131 on the substrate 110 at least partially coincides with the boundary line of the orthographic projection of the inorganic dielectric layer 210 on the substrate 110.

For example, the entire boundary of the inorganic encapsulation layer 131 is flush with the entire boundary of the inorganic dielectric layer 210.

For example, a portion of the boundary of the inorganic encapsulation layer 131 is flush with a portion of the boundary of the inorganic dielectric layer 210.

By using the above-described setting method, the flush boundaries may be formed by etching in the same patterning process, thereby simplifying the manufacturing process of the inorganic encapsulation layer 131 and the inorganic dielectric layer 210.

Figure 3E:
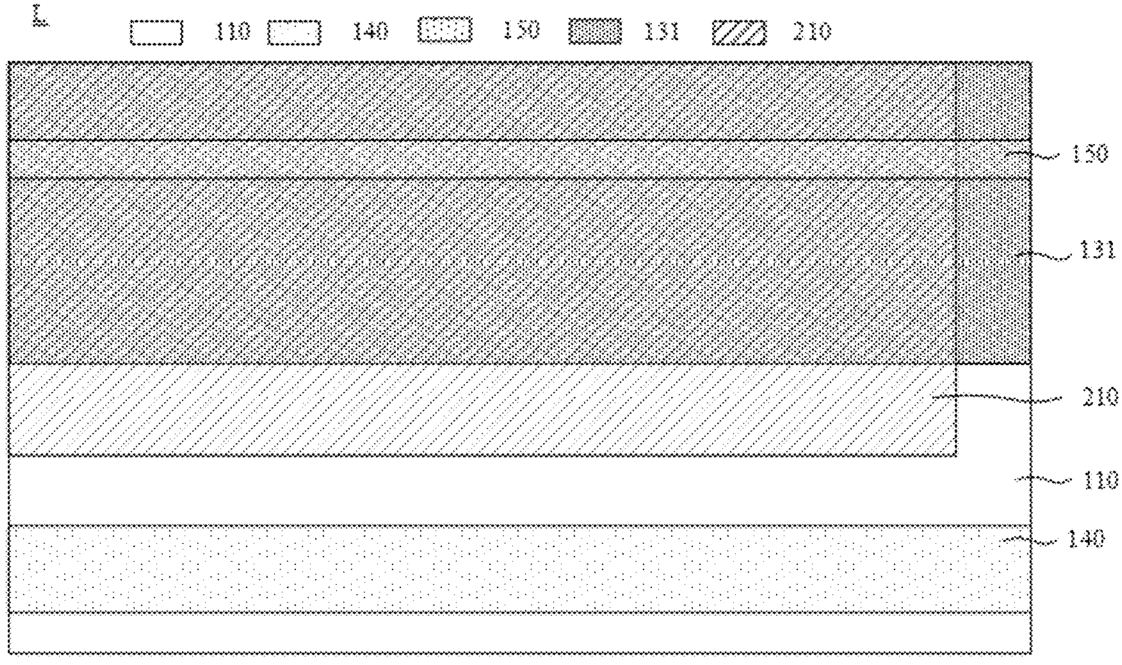
FIG. 3*e* is a partial enlarged view of yet some other film layers in the L region of the display panel shown in FIG. 2.
Figure 3F:
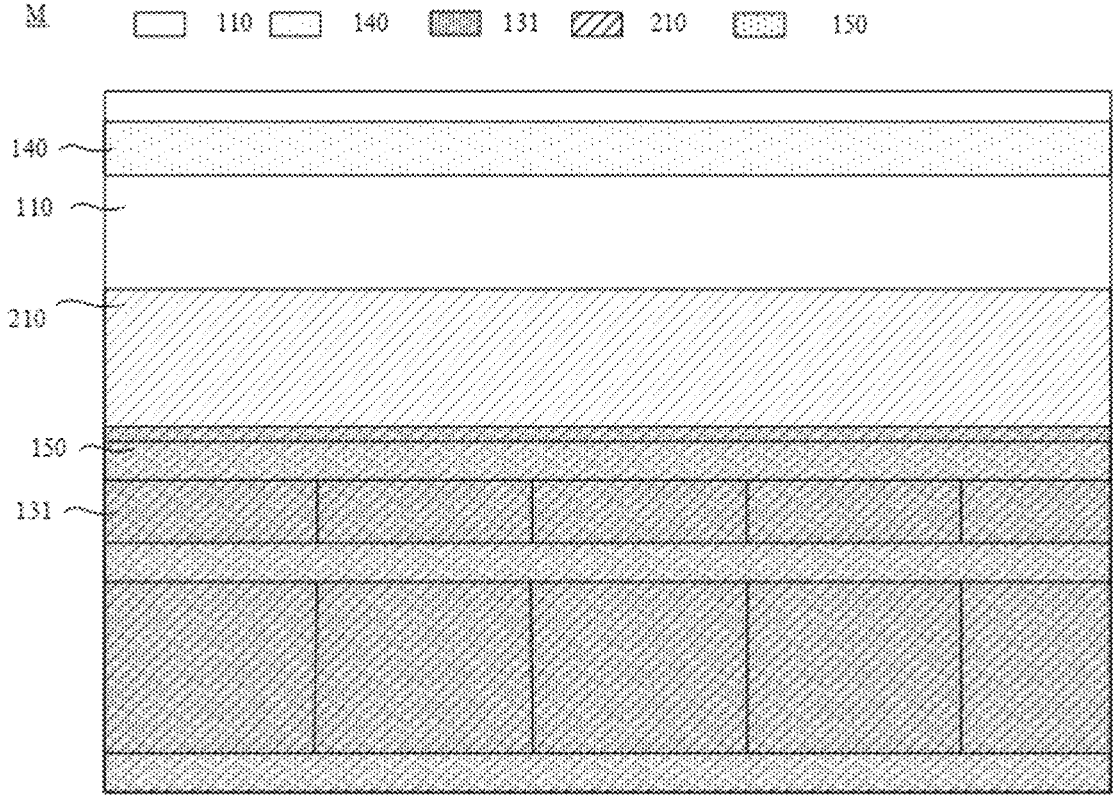
FIG. 3*f* is a partial enlarged view of some film layers in the M region of the display panel shown in FIG. 2.

In some examples, as shown in FIGS. 3*e*, 3*f*, and 6*a*, the inorganic dielectric layer 210 covers at least a portion of the boundary of the inorganic encapsulation layer 131.

For example, as shown in FIGS. 6*a* and 6*b*, the inorganic dielectric layer 210 covers the entire boundary of the inorganic encapsulation layer 131. The entire boundary line of the orthographic projection of the inorganic encapsulation layer 131 on the substrate 110 may be located inside the boundary line of the orthographic projection of the inorganic dielectric layer 210 on the substrate 110.

For example, the inorganic dielectric layer 210 covers a portion of the boundary of the inorganic encapsulation layer 131. A portion of the boundary line of the orthographic projection of the inorganic encapsulation layer 131 on the substrate 110 is located inside the boundary line of the orthographic projection of the inorganic dielectric layer 210 on the substrate 110.

By using the above-described setting method, water vapor may be prevented from intruding from the interface between the inorganic dielectric layer 210 and the organic structure 140 during the water process, and the touch function layer 200 may be prevented from being peeled off from the display substrate 100, thereby improving the yield rate of the display panel 10 and the display apparatus 1, reducing the production cost of the display panel 10 and the display apparatus 1. In addition, the inorganic dielectric layer 210 covers the inorganic encapsulation layer 131, and the inorganic dielectric layer 210 covers at least a portion of the boundary of the inorganic encapsulation layer 131. The inorganic dielectric layer 210 may be used to further enhance the encapsulation effect of the inorganic encapsulation layer 131, thereby improving the light-emitting performance and light-emitting life of the light-emitting devices 102, thereby reducing the production cost of the display panel 10 and the display apparatus 1.

In some embodiments, the orthographic projection of the inorganic encapsulation layer 131 on the substrate 110 is located within a range of the orthographic projection of the inorganic dielectric layer 210 on the substrate 110.

For example, the boundary line of the orthographic projection of the inorganic encapsulation layer 131 on the substrate 110 is located within the boundary line of the orthographic projection of the inorganic dielectric layer 210 on the substrate 110.

For example, the area of a portion of the substrate 110 covered by the inorganic encapsulation layer 131 is less than the area of a portion of the substrate 110 covered by the inorganic dielectric layer 210, and the boundary line of the orthographic projection of the inorganic encapsulation layer 131 on the substrate 110 may be located within the boundary line of the orthographic projection of the inorganic dielectric layer 210 on the substrate 110.

By using the above-described setting method, water vapor may be prevented from intruding from the interface between the inorganic dielectric layer 210 and the organic structure 140 during the water process, and the touch function layer 200 may be prevented from being peeled off from the display substrate 100, thereby improving the yield rate of the display panel 10 and the display apparatus 1, reducing the production cost of the display panel 10 and the display apparatus 1. In addition, the inorganic dielectric layer 210 covers the inorganic encapsulation layer 131, and the boundary line of the orthographic projection of the inorganic encapsulation layer 131 on the substrate 110 is located within the boundary line of the orthographic projection of the inorganic dielectric layer 210 on the substrate 110, so as to enhance the encapsulation effect of the inorganic encapsulation layer 131, thereby improving the light-emitting performance and light-emitting life of the light-emitting devices 102, thereby reducing the production cost of the display panel 10 and the display apparatus 1.

In some examples, the orthographic projection of the inorganic encapsulation layer 131 on the substrate 110 coincides with the orthographic projection of the inorganic dielectric layer 210 on the substrate 110.

For example, the boundary line of the orthographic projection of the inorganic encapsulation layer 131 on the substrate 110 coincides with the boundary line of the orthographic projection of the inorganic dielectric layer 210 on the substrate 110.

By using the above-described setting method, since the inorganic encapsulation layer 131 and the inorganic dielectric layer 210 are both made of inorganic materials, the bonding force of an interface between the two is relatively large, which may improve the bonding strength of the touch function layer 200 and the display substrate 100, so that water vapor may be prevented from intruding from the interface between the inorganic dielectric layer 210 and the organic structure 140 during the water process, and the touch function layer 200 may be prevented from being peeled off from the display substrate 100, thereby improving the yield rate of the display panel 10 and the display apparatus 1, reducing the production cost of the display panel 10 and the display apparatus 1. In addition, the orthographic projection of the inorganic encapsulation layer 131 on the substrate 110 coincides with the orthographic projection of the inorganic dielectric layer 210 on the substrate 110, which may simplify the preparation process of the inorganic encapsulation layer 131 and the inorganic dielectric layer 210.

In some examples, a distance between an outer boundary of the orthographic projection of the first barrier wall 120 on the substrate 110 and the boundary of the orthographic projection of the inorganic encapsulation layer 131 on the substrate 110 ranges from: 80 μm to 130 μm.

Here, the outer boundary of the orthographic projection of the first barrier wall 120 on the substrate 110 refers to a boundary on a side away from the display area A among boundaries of the orthographic projection of the first barrier wall 120 on the substrate 110.

For example, the distance between the outer boundary of the orthographic projection of the first barrier wall 120 on the substrate 110 and the boundary of the orthographic projection of the inorganic encapsulation layer 131 on the substrate 110 may be 80 μm, 100 μm, 110 μm, 121 μm or 130 μm.

The above-described setting method may effectively prevent water vapor from invading from the inorganic encapsulation layer 131 across the first barrier wall 120 to the display area A of the display panel 10, thus ensuring the encapsulation effect of the inorganic encapsulation layer 131 and improving the yield rate of the display panel 10 and the display apparatus 1.

In some examples, a distance between the outer boundary of the orthographic projection of the first barrier wall 120 on the substrate 110 and the boundary of the orthographic projection of the organic structure 140 on the substrate 110 is greater than or equal to 130 μm.

For example, the distance between the outer boundary of the orthographic projection of the first barrier wall 120 on the substrate 110 and the boundary of the orthographic projection of the organic structure 140 on the substrate 110 may be 130 μm, 135 μm, 137 μm, 140 μm or 142 μm.

It can be understood that, the distance between the outer boundary of the orthographic projection of the first barrier wall 120 on the substrate 110 and the boundary of the orthographic projection of the inorganic encapsulation layer 131 on the substrate 110 is less than the distance between the outer boundary of the orthographic projection of the first barrier wall 120 on the substrate 110 and the boundary of the orthographic projection of the organic structure 140 on the substrate 110. And for the distance between the outer boundary of the orthographic projection of the first barrier wall 120 on the substrate 110 and the boundary of the orthographic projection of the inorganic encapsulation layer 131 on the substrate 110 and the distance between the outer boundary of the orthographic projection of the first barrier wall 120 on the substrate 110 and the boundary of the orthographic projection of the organic structure 140 on the substrate 110, the two distances do not simultaneously take the value 130 μm.

Setting the distance between the first barrier wall 120 and the organic structure 140 within the above range may ensure that the inorganic encapsulation layer 131 and the organic structure 140 do not overlap, and may ensure the encapsulation effect of the inorganic encapsulation layer 131.

In some embodiments, as shown in FIG. 6*a*, the substrate 110 includes a main portion 111 and a bending portion 112 connected to the main portion 111.

For example, the aforementioned pixel driving circuits 101 and light-emitting devices 102 may be located at the main portion 111. A part of the main portion 111 is located in the display area A of the display panel 10, and the other part of the main portion 111 is located in the peripheral area B of the display panel 10. The bending portion 112 may be located in the bending region K of the display panel 10.

For example, the display substrate 100 includes bonding pins. The bonding pins are electrically connected to the driver chip. The bonding pins can receive signals from the driver chip and transmit the signals to signal lines or pixel driving circuits 101.

For example, the bonding pins may be located on the bending portion 112 of the substrate 110. During the preparation process of the display panel 10, the bonding pins may be placed on the non-light-exit side of the display panel 10 with the bending portion 112 of the substrate 110, whereby the size of the bezel in the display panel 10 may be reduced, thereby facilitating the narrow bezel design of the display panel 10 and the display apparatus 1.

In some examples, the first barrier wall 120 is located at the main portion 111, so the first barrier wall 120 is not bent.

In some examples, as shown in FIG. 3*a*, in a case where the organic layer in the organic structure 140 includes multiple organic layers, the multiple organic layers include: at least one first organic layer 141 and at least one second organic layer 142 located on a side of the at least one first organic layer 141 away from the substrate 110.

For example, the multilayer organic layers in the organic structure 140 may be located in a portion of the peripheral area B that is on the lower side of the display panel 10.

For example, the multiple organic layers in the organic structure 140 include: one first organic layer 141 and one second organic layer 142.

As another example, the multiple organic layers in the organic structure 140 include: two first organic layers 141 and one second organic layer 142.

As another example, the multiple organic layers in the organic structure 140 include: two first organic layers 141 and two second organic layers 142.

For example, the first organic layer 141 is closer to the substrate 110 than the second organic layer 142.

The arrangement of the multiple organic layers may effectively avoid cracks in the display panel 10 during the bending process, or prevent cracks from spreading on the display panel 10 if cracks occur.

It can be understood that there are various positional relationships between the multiple organic layers of the organic structure 140 and between the multiple organic layers and the substrate 110, which can be set according to actual needs, and the present disclosure does not limit this.

For example, the at least one first organic layer 141 is located at the main portion 111 and the bending portion 112, and the at least one second organic layer 142 is located at least at the bending portion 112.

For example, in a case where the organic structure 140 includes one first organic layer 141 and one second organic layer 142, the first organic layer 141 is located at the main portion 111 and the bending portion 112, and a portion of the second organic layer 142 is located at the bending portion 112.

As another example, in a case where the organic structure 140 includes two first organic layers 141 and two second organic layers 142, one first organic layer 141 is located at the main portion 111 and the bending portion 112, and the other first organic layer 141 is also located at the main portion 111 and the bending portion 112, one second organic layer 142 is located only at the bending portion 112, and the other is also located only at the bending portion 112.

For example, the above-mentioned multiple organic layers are sequentially stacked on the substrate 110. The area of an orthographic projection of each organic layer on the substrate 110 may be different, and corresponding boundary lines of the organic layers may be partially overlapping. Of course, the area of the orthographic projection of each organic layer on the substrate 110 may also be the same, and the corresponding boundary lines of the organic layers may completely overlap.

For example, a portion of the multiple organic layers provided in correspondence with the bending portion 112 of the substrate 110 will be bent with the bending portion 112 during the preparation process of the display panel 10, and due to the flexibility of the material of the organic layers, cracks on the display panel 10 may be avoided and the spreading of cracks may be slowed down, which in turn may effectively reduce the risk of cracks on the display panel 10 and improve the quality of the display panel 10.

In some embodiments, as shown in FIG. 4, the display substrate 100 further includes: at least one planarization layer 150 provided on the first side 110*a* of the substrate 110, and a pixel defining layer 160 provided on a side of the planarization layer 150 away from the substrate 110.

For example, one planarization layer 150 is provided on the first side 110*a* of the substrate 110, in this case, the display panel 10 may have a single SD structure. The planarization layer 150 may be provided between the pixel driving circuits 101 of the display substrate 100 and the first electrodes 1021 of the light-emitting devices 102, for realizing electrical insulation between the source-drain conductive layer SD in the pixel driving circuits 101 and the first electrodes 1021.

For example, two planarization layers 150 are provided on the first side 110*a* of the substrate 110, in this case, the display panel 10 may have a double SD structure. One of the planarization layers 150 may be provided between the pixel driving circuits 101 of the display substrate 100 and the first electrodes 1021 of the light-emitting devices 102, for realizing electrical insulation between a source-drain conductive layer SD in the pixel driving circuits 101 and the first electrodes 1021; and the other of the planarization layers 150 may be provided between two source-drain conductive layers SD in the pixel driving circuits 101 of the display substrate 100, for realizing electrical insulation between the two source-drain conductive layers SD.

For example, materials of the planarization layer 150 and the pixel defining layer 160 are both organic materials.

For example, the pixel defining layer 160 is provided on a side of the first electrodes 1021 away from the substrate 110. A plurality of openings are provided in the pixel defining layer 160. A first electrode 1021 is exposed by an opening, and an opening is provided corresponding to a first electrode 1021, so that crosstalk between the light emitted by adjacent light-emitting devices 102 may be avoided.

In some examples, as shown in FIG. 4, the display substrate 100 further includes spacers 180 provided on a side of the pixel defining layer 160 away from the substrate 110.

For example, the spacers 180 may be made of an organic insulating material.

For example, the spacers 180 may be distributed in the display area A and the peripheral area B.

For example, during the evaporation process of the light-emitting function layers 1023 in the light-emitting devices 102, the spacers 180 can be used to support the high-precision metal mask (Fine Metal Mask, FMM for short) to improve the evaporation effect of the FMM, thereby improving the light-emitting performance of the light-emitting function layers 1023 and the light-emitting devices 102.

In some examples, the first organic layer 141 and the planarization layer 150 are arranged in the same layer, and the second organic layer 142 and the pixel defining layer 160 are arranged in another same layer.

For example, the first organic layer 141 and the planarization layer 150 may be made of the same material, such as an organosiloxane resin, which has good leveling properties. Thus, the planarization layer 150 formed on the pixel driving circuits 101 may provide a flat base for the first organic layer 141 formed subsequently, so that the first organic layer 141 formed may further improve the flatness of a surface of the organic structure 140.

For example, the second organic layer 142 and the pixel defining layer 160 may be made of the same material, such as polyacrylate.

It will be noted that, the "same layer" mentioned in the present disclosure refers to a layer structure that is formed by performing, using a same mask, a single patterning process on a film layer for forming specific patterns that is formed by a same film forming process. Depending on different specific patterns, the single patterning process may include several exposure, development or etching processes, and the specific patterns in the formed layer structure may be continuous or discontinuous, and these specific patterns may also be at different heights or have different thicknesses. In this way, the patterns of the first organic layer 141 and the planarization layer 150 may be produced simultaneously, and the patterns of the second organic layer 142 and the pixel defining layer 160 may be produced simultaneously, which is beneficial to simplifying the manufacturing process of the display panel 10 and the display apparatus 1.

In a case where the display substrate 100 includes the spacers 180, the second organic layer 142 may also be provided in the same layer as the spacers 180. Therefore, the second organic layer 142 and the spacers 180 may be produced simultaneously, which is beneficial to simplifying the manufacturing process of the display panel 10 and the display apparatus 1.

In some embodiments, as shown in FIG. 2, a shape of the display panel 10 includes an approximate rectangle.

For example, the above-mentioned approximate rectangle is not a rectangle in the strict sense. For example, the vertex corners of the approximate rectangle may be rounded corners. The overall outline of the display panel 10 is in a shape of an approximate rectangle.

For example, the peripheral area B includes a first side edge, a second side edge, a third side edge and a fourth side edge. The fourth side edge is provided corresponding to the bending portion, and the fourth side edge and the second side edge are located on opposite sides of the display area A.

For example, the first side edge and the third side edge described above are portions of the peripheral area B in FIG. 2 on the left and right sides of the display panel 10, the second side edge is a portion of the peripheral area B in FIG. 2 on the upper side of the display panel 10, and the fourth side edge is a portion of the peripheral area B in FIG. 2 on the lower side of the display panel 10.

In some examples, in a case where the organic structure 140 includes one first organic layer 141 and at least one second organic layer 142, the first organic layer 141 is located within a region corresponding to the first side edge, the second side edge, the third side edge and the fourth side edge, and the at least one second organic layer 142 is located within a region corresponding to the fourth side edge.

For example, in a case where the organic structure 140 includes one first organic layer 141 and two second organic layers 142, the first organic layer 141 is located within the region corresponding to the four side edges, i.e., the first side edge, the second side edge, the third side edge and the fourth side edge, of the display panel 10, and the two second organic layers 142 are located within the region corresponding to the fourth side edge. FIG. 3*b* illustrates a case where the first organic layer 141 is located in a region corresponding to the third side edge.

In addition, in a case where the organic structure 140 includes two first organic layers 141 and two second organic layers 142, the two first organic layers 141 are located within the region corresponding to the first side edge, the second side edge, the third side edge and the fourth side edge, and the two second organic layers 142 are located within the region corresponding to the fourth side edge. FIG. 3*a* illustrates a case where the two first organic layers 141 and the two second organic layers 142 are all located in the region corresponding to the fourth side edge.

By using the above-described setting method, in the process of bending the bending region K of the display panel 10 to form a curved screen, the above-described organic structure 140 may cushion the bending stress to which the display panel 10 is subjected to avoid cracks on the first side edge, the second side edge, and the third side edge of the display panel 10; and in the process of bending the bending portion 112 of the display panel 10, so that the bending portion 112 is placed on the back side of the display panel 10 to realize a narrow bezel design of the display panel, the above-described organic structure 140 may cushion the bending stress to which the display panel 10 is subjected, avoiding cracks on the fourth side edge of the display panel 10, and thereby improving the quality of the display panel 10.

In some embodiments, as shown in FIGS. 4 and 6*a*, the display substrate 100 further includes multiple first inorganic insulating layers 170 provided on the first side 110*a* of the substrate 110, and the multiple first inorganic insulating layers 170 include at least a gate dielectric layer 171 and an interlayer dielectric layer 172.

For example, the multiple first inorganic insulating layers 170 include one gate dielectric layer 171 and one interlayer dielectric layer 172.

As another example, the multiple first inorganic insulating layers 170 include multiple gate dielectric layers 171 and multiple interlayer dielectric layers 172.

For example, the gate dielectric layer 171 is closer to the substrate 110 than the interlayer dielectric layer 172.

For example, the gate dielectric layer 171 is disposed between the active layer PL and the gate conductive layer GT in the above-mentioned pixel circuit layer, and is used to isolate the active layer PL from the gate conductive layer GT, thereby realizing the electrical insulation between the active layer PL and the gate conductive layer GT.

For example, the interlayer dielectric layer 172 is disposed between the gate conductive layer GT and the source-drain conductive layer SD in the above-mentioned pixel circuit layer, and is used to isolate the gate conductive layer GT from the source-drain conductive layer SD, thereby realizing the electrical insulation between the gate conductive layer GT and the source-drain conductive layer SD.

For example, the multiple first inorganic insulating layers 170 are located in the display area A of the display panel 10 and in a portion of the peripheral area B except for the bending region K.

For example, as shown in FIG. 6*b*, a portion of the multiple first inorganic insulating layer 170 located in the peripheral area B may include multiple groove-shaped structures.

The number of the above-mentioned groove structures may be 2, 3, or 6.

For example, the above-described groove-shaped structures are generally located in the portions of the peripheral area B on the left and right sides and the upper side of the display panel 10, that is to say, the above-described groove-shaped structures exist simultaneously with the cutting line CL. In the process of cutting the display motherboard along the cutting line CL to form the display panel 10, the above-described groove-like structures can also cushion the cutting stress to which the display panel 10 is subjected, so that a portion of the cutting stress can be released, and a problem such as cracks appearing in the periphery of the display panel 10 due to the concentration of the cutting stress may be avoided, so that the quality of the display panel 10 and the display apparatus 1 may be improved. In addition, during the bending process of the bending region K of the display panel 10, the external force to which the first inorganic insulating layer 170 is subjected can be released at the above-described groove-like structures and the above-described organic structure 140, avoiding cracks in the first inorganic insulating layer 170 due to the concentration of the stress, and avoiding affecting the quality of the display panel 10 and the display apparatus 1.

For example, a portion of the substrate 110 covered by each of the multiple first inorganic insulating layers 170 may have the same or different area.

For example, in a case where a portion of the substrate 110 covered by each of the multiple first inorganic insulating layers 170 has the same area, the boundaries of the multiple first inorganic insulating layers 170 may overlap.

As another example, in a case where portions of the substrate 110 covered by the multiple first inorganic insulating layers 170 have different areas, the boundaries of the multiple first inorganic insulating layers 170 may partially overlap. And non-overlapping boundaries among the boundaries of the multiple first inorganic insulating layers 170 may form steps on the first side 110*a* of the substrate 110.

In some examples, the multiple first inorganic insulating layers 170 further include: a buffer layer and a barrier layer disposed between the substrate 110 and the gate dielectric layer 171.

For example, the buffer layer is used to block the intrusion of water vapor from the substrate 110 to the light-emitting devices 102, thereby protecting the light-emitting devices 102.

For example, the barrier layer is used to block water vapor and impurity ions from intruding into the light-emitting devices 102 from one side of the substrate 110, thereby protecting the light-emitting devices 102.

In some examples, as shown in FIG. 3*a*, the first barrier wall 120 and the organic structure 140 are both located on a side of the multiple first inorganic insulating layers 170 away from the substrate 110.

In some embodiments, as shown in FIG. 3*a*, the inorganic dielectric layer 210 in the above-mentioned touch function layer includes an inorganic barrier layer 211 and a second inorganic insulating layer 212 stacked in sequence, in which the inorganic blocking layer 211 can be used to block impurity ions and the like from entering the touch function layer 200, and the second inorganic insulating layer 212 can be used to achieve electrical insulation.

For example, the inorganic barrier layer 211 and the second inorganic insulating layer 212 may both be made of inorganic insulating materials, such as silicon nitride (SiNx).

In some examples, as shown in FIG. 3*a*, the inorganic encapsulation layer 131 is in contact with a portion, located between the first barrier wall 120 and the organic structure 140, of the multiple first inorganic insulating layers 170.

There is a certain distance between the first barrier wall 120 and the organic structure 140. The inorganic encapsulation layer 131 and the multiple first inorganic insulating layers 170 are in contact with each other within this distance.

By using the above-described setting method, since the inorganic encapsulation layer 131 and the multiple first inorganic insulating layers 170 are both made of inorganic materials, the interfacial bonding of a portion of the inorganic encapsulation layer 131 in contact with the multiple first inorganic insulating layers 170 is relatively large, thereby reducing the water vapor intrusion may cause the risk of peeling off of the inorganic encapsulation layer 131, thereby improving the encapsulation effect of the inorganic encapsulation layer 131.

In some examples, as shown in FIG. 6*a*, the inorganic dielectric layer 210 is in contact with a portion, located between the first barrier wall 120 and the organic structure 140, of the multiple first inorganic insulating layers 170.

By using the above-described setting method, since the inorganic dielectric layer 210 and the multiple first inorganic insulating layers 170 are both made of inorganic materials, the interfacial bonding of a portion of the inorganic dielectric layer 210 in contact with the multiple first inorganic insulating layers 170 is relatively large, thereby reducing the water vapor intrusion may cause the risk of peeling off of the inorganic encapsulation layer 131, thereby preventing the peeling of the inorganic dielectric layer 210, thereby improving the yield rate of the display panel 10 and the display apparatus.

In some examples, as shown in FIG. 4, the touch function layer 200 further includes a first touch electrode layer 213, a second touch electrode layer 214, and a protective layer 215.

For example, the first touch electrode layer 213 is provided between the inorganic barrier layer 211 and the second inorganic insulating layer 212, and the second touch electrode layer 214 is provided on a side of the second inorganic insulating layer 212 away from the inorganic barrier layer 211.

For example, the second touch electrode layer 214 includes a plurality of second touch patterns, and the plurality of second touch patterns constitute a plurality of transmitting electrode blocks and a plurality of receiving electrode blocks for implementing the touch function. For example, the first touch electrode 213 includes a plurality of first touch patterns, and the plurality of first touch patterns may be used as bridge patterns for the above-mentioned transmitting electrode blocks or receiving electrode blocks.

For example, the first touch electrode layer 213 may be formed by stacking two oxide film layers and one metal film layer, such as indium tin oxide/silver/indium tin oxide (ITO/Ag/ITO); alternatively, the first touch electrode layer 213 may be formed by stacking three metal film layers, such as titanium/aluminum/titanium (Ti/Al/Ti).

The first touch electrode layer 213 and the second touch electrode layer 214 may be made of the same or different materials.

For example, the first touch electrode layer 213 and the second touch electrode layer 214 are located in the display area A. The first touch electrode layer 213 and the second touch electrode layer 214 cooperate with each other to implement the touch function of the display area A.

For example, the protective layer 215 is provided on a side of the second touch electrode layer 214 away from the inorganic barrier layer 211. The protective layer 215 is used to protect the touch function layer 200 from external damage. In addition, the protective layer 215 also has a planarizing effect, making the surface of the touch function layer 200 relatively flat.

For example, the protective layer 215 may be made of an organic material. Optionally, the material of the protective layer 215 may be PI.

For example, the protective layer 215 covers at least a portion of the organic structure 140.

For example, the protective layer 215 may cover a portion of the organic structure 140 located on the main portion 111 of the substrate 110.

As another example, the protective layer 215 may cover the entire side of the organic structure 140 away from the substrate 110.

Since the protective layer 215 and the organic structure 140 are both made of organic materials, the bonding force of the interface between the two is relatively large. By using the above-described setting method, the adhesion force of the touch function layer 200 and the display substrate 100 may be increased, and the risk of peeling off the touch function layer 200 from the display substrate 100 may be reduced, thereby improving the yield rate of the display panel 10 and the display apparatus 1, and reducing the production cost of the display panel 10 and the display apparatus 1.

In some examples, the touch function layer 200 further includes a plurality of touch traces.

For example, the plurality of touch traces are located in the peripheral area B and the bending portion 112 of the substrate 110. One end of each touch trace is connected to a first touch pattern of the first touch electrode layer 213 or a second touch pattern of the second touch electrode layer 214, and the other end of each touch trace is connected to a bonding pin, which is connected to the driver chip. The touch signal sent by the driver chip may be transmitted to the first touch pattern of the first touch electrode layer 213 or the second touch pattern of the second touch electrode layer 214 via the bonding pin and the touch trace; and the driver chip may also receive touch information from the first touch pattern and the second touch pattern via the bonding pin and the touch trace, so as to realize the touch function of the display panel 10.

For example, the material of the plurality of touch traces may be the same as the material of the first touch electrode layer 213, and the plurality of touch traces may be arranged in the same layer as the first touch electrode layer 213. As a result, the plurality of touch traces and the first touch electrode layer 213 may be manufactured simultaneously, which is beneficial to simplifying the manufacturing process of the display panel 10 and the display apparatus 1.

For example, the material of the plurality of touch traces may be the same as the material of the second touch electrode layer 214, and the plurality of touch traces may be arranged in the same layer as the second touch electrode layer 214. As a result, the plurality of touch traces and the second touch electrode layer 214 may be manufactured simultaneously, which is beneficial to simplifying the manufacturing process of the display panel 10 and the display apparatus 1.

Of course, a part of the plurality of touch traces may be arranged in the same layer as the first touch electrode layer 213, and the other part of the plurality of touch traces may be arranged in the same layer as the second touch electrode layer 214. As a result, the above-mentioned part of the touch traces and the first touch electrode layer 213 may be manufactured simultaneously, and the above-mentioned other part of the touch traces and the second touch electrode layer 214 may be manufactured simultaneously, which is beneficial to simplifying the manufacturing process of the display panel 10 and the display apparatus 1.

Figure 7:
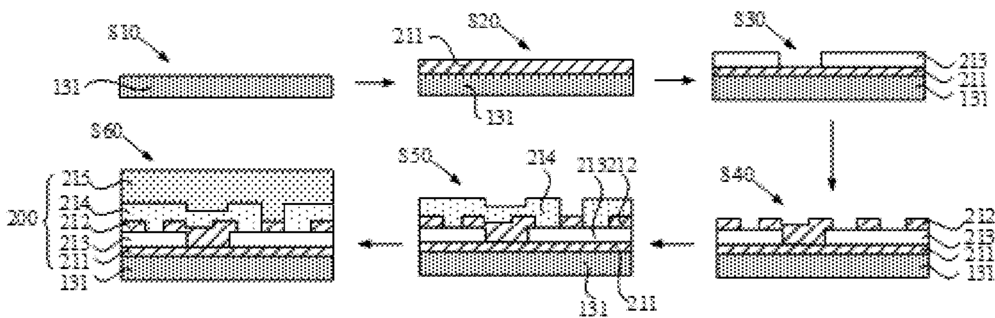
FIG. 7 is a flow diagram of manufacturing a touch function layer, in accordance with some embodiments of the present disclosure.

In some examples, the manufacturing process of the touch function layer 200 is shown in FIG. 7.

In S10, the inorganic encapsulation layer 131 is formed on the surface of the display substrate 100, and the water process is used to clean the surface of the inorganic encapsulation layer 131.

In S20, the inorganic barrier layer 211 is formed on the surface of the inorganic encapsulation layer 131, and the water process is used to clean the surface of the inorganic barrier layer 211 away from the display substrate 100.

In S30, the first touch electrode layer 213 is formed on the surface of the inorganic barrier layer 211 away from the inorganic encapsulation layer 131. The first touch electrode layer 213 includes the plurality of first touch patterns. The plurality of first touch patterns are located in the display area A of the display panel 10.

In S40, the second inorganic insulating layer 212 is formed on the surface of the first touch electrode layer 213 away from the inorganic barrier layer 211, and a water cleaning process is used to clean the surface of the second inorganic insulating layer 212 away from the first touch electrode layer 213.

In S50, the second touch electrode layer 214 is formed on the surface of the second inorganic insulating layer 212 away from the first touch electrode layer 213. The second touch electrode layer 214 includes the plurality of second touch patterns, and the plurality of second touch patterns are located in the display area A.

In S60, the protective layer 215 is formed on the surface of the second touch electrode layer 214 away from the second inorganic insulating layer 212.

In some embodiments, as shown in FIG. 4, the display substrate 100 further includes at least one second barrier wall 121 disposed between the display area A and the first barrier wall 120, and the second barrier wall 121 surrounds the display area A.

For example, the display area A and the first barrier wall 120 may be provided therebetween with one or two second barrier walls 121.

For example, the first barrier wall 120 and the at least one second barrier wall 121 are both used to block the material of the organic encapsulation layer.

For example, the height of the first barrier wall 120 and the height of the second barrier wall 121 may be the same or different, which may be set according to the actual situation, and the present disclosure does not limit this.

The formation process of the first barrier wall 120 will be described below. Of course, there are many processes for forming the first barrier wall 120, which may be selected according to the actual situation, and the present disclosure does not limit this.

Taking the display panel 10 as a single SD structure as an example, the display panel 10 includes one planarization layer 150, one pixel defining layer 160 and one layer of spacers 180, and the display panel includes one first barrier wall 120 and two second barrier walls 121. First, a planarization layer film is formed, then the planarization layer film is patterned to form the planarization layer 150, and a patterned first sub-portion pattern is simultaneously formed at a position where the first barrier wall 120 is to be formed. Then, a pixel defining layer film is formed, then the pixel defining layer film is patterned to form the pixel defining layer 160, and a second sub-portion pattern is simultaneously formed at a position corresponding to the first sub-portion pattern. Then a spacer film is formed, then the spacer film is patterned to form the spacers 180, and a third sub-portion pattern is simultaneously formed at a position corresponding to the second sub-portion pattern. The first sub-portion pattern, the second sub-portion pattern and the third sub-portion pattern form the first barrier wall 120. Therefore, the height of the first barrier wall 120 is approximately the same as the sum of the thicknesses of the planarization layer 150, the pixel defining layer 160, and the spacers 180. In this case, the height of a second barrier wall 121 proximate to the display area A may be approximately the same as the sum of the thicknesses of the pixel defining layer 160 and the spacers 180; and the height of a second barrier wall 121 proximate to the first barrier wall 120 may be approximately the same as the height of the first barrier wall 120, that is, approximately the same as the sum of the thicknesses of the planarization layer 150, the pixel defining layer 160, and the spacers 180. Of course, the formation process of the two second barrier walls 121 is similar to the formation process of the above-mentioned first barrier wall 120 and will not be described again here.

In addition, in a case where the display panel 10 as a double SD structure as an example, the display panel 10 includes two planarization layers 150, one pixel defining layer 160 and one layer of spacers 180, and the display panel includes one first barrier wall 120 and two second barrier walls 121, the height of the first barrier wall 120 may be approximately the same as the sum of the thicknesses of the two planarization layers 150, the pixel defining layer 160, and the spacers 180; the height of a second barrier wall 121 proximate to the display area A may be approximately the same as the sum of the thicknesses of the second planarization layer 150, the pixel defining layer 160 and the spacers 180; and the height of a second barrier wall 121 proximate to the first barrier wall 120 may be approximately the same as the height of the first barrier wall 120, that is, approximately the same as the sum of the thicknesses of the two planarization layers 150, the pixel defining layer 160, and the spacers 180. Of course, the formation process of the two second barrier walls 121 is similar to the formation process of the above-mentioned first barrier wall 120 and will not be described again here.

In the display substrate in another implementation, the inorganic encapsulation layer of the film encapsulation layer is usually produced using a vapor deposition process. The mask used in the vapor deposition process is at a certain distance from a surface on which a material to be deposited, so that the material of the inorganic encapsulation layer will be deposited through the mask into a shadow region (the region not intended for deposition). The thickness of the inorganic encapsulation thinned portion located in the shadow region is small, the film quality is poor, and the bonding force of the inorganic encapsulation thinned portion with the inorganic dielectric layer is poor, which makes it easy to cause the inorganic dielectric layer and the inorganic encapsulation layer peel off, making it easy for the touch function layer to be peeled off from the inorganic encapsulation layer, lowering the yield rate of the display panel and the display apparatus, and increasing the cost of production of the display panel and the display apparatus.

Figure 9:
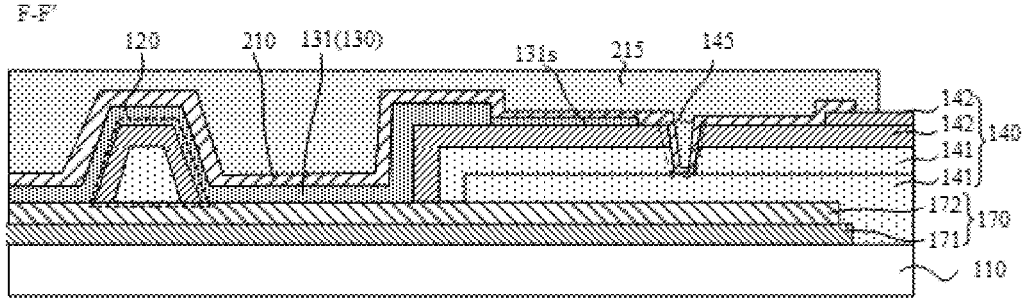
FIG. 9 is a sectional view of the display panel shown in FIG. 8*a* taken along the line F-F'.

In light of this, some embodiments of the present disclosure provide a display panel 10. As shown in FIG. 9, an orthographic projection of the inorganic encapsulation layer 131 on the substrate 110 partially overlaps with an orthographic projection of the organic structure 140 on the substrate 110; and the orthographic projection of the inorganic encapsulation layer 131 on the substrate 140 is located within a range of an orthographic projection of the inorganic dielectric layer 210 on the substrate 110, or the orthographic projection of the inorganic encapsulation layer 131 on the substrate 110 coincides with the orthographic projection of the inorganic dielectric layer 210 on the substrate 110.

Figure 8A:
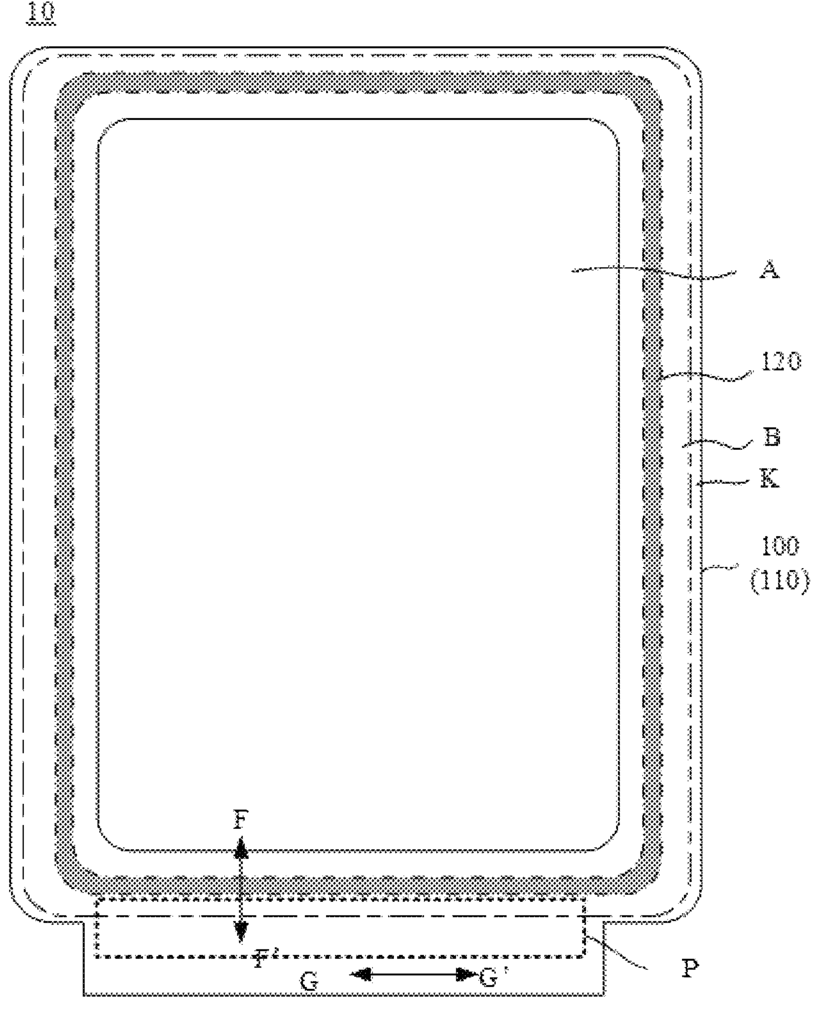
FIG. 8*a* is a structural diagram of yet another display panel, in accordance with some embodiments of the present disclosure.

FIG. 8*a* is a top view of the display panel 10 as shown in FIG. 9.

For example, as shown in FIG. 9, the inorganic encapsulation layer 131 includes an inorganic encapsulation thinned portion 131*s*.

For example, the inorganic encapsulation thinned portion 131*s* is a portion located at an edge of the inorganic encapsulation layer 131, e.g., located on the surface of the organic structure 140. The inorganic encapsulation thinned portion 131*s* is formed due to the limitations of the vapor deposition process during the deposition of the inorganic encapsulation layer 131, and is not a necessary portion of the inorganic encapsulation layer 131. The thickness of the inorganic encapsulation thinned portion 131*s* is small, smaller than the thickness of other portions of the inorganic encapsulation layer 131, and the film quality is poor.

For example, a boundary line of the orthographic projection of the inorganic encapsulation layer 131 on the substrate 110 intersects a boundary line of the orthographic projection of the organic structure 140 on the substrate 110, and a portion of the inorganic encapsulation layer 131 covers the organic structure 140.

In some examples, the boundary line of the orthographic projection of the inorganic encapsulation layer 131 on the substrate 110 is located within the boundary line of the orthographic projection of the inorganic dielectric layer 210 on the substrate 110. Since a portion of the inorganic encapsulation layer 131 covers the organic structure 140, a portion of the inorganic dielectric layer 210 also covers the organic structure 140; and the area of an orthographic projection of the inorganic dielectric layer 210 on the organic structure 140 is greater than the area of an orthographic projection of the inorganic encapsulation layer 131 on the organic structure 140.

By using the above-described setting method, the inorganic dielectric layer 210 can cover the inorganic encapsulation thinned portion 131*s* of the inorganic encapsulation layer 131 and continue to extend to cover the surface of the organic structure 140, thereby increasing the contact area of the inorganic dielectric layer 210 and the organic structure 140. In this way, the bonding force of the interface between the inorganic dielectric layer 210 and the organic structure 140 is increased, thereby improving the bonding force of the interface between the touch function layer 200 and the display substrate 100, and preventing the inorganic dielectric layer 210 from peeling off the inorganic encapsulation thinned portion 131*s*, thereby preventing the peeling off of the touch function layer 200. Thereby, the yield rate of the display panel 10 and the display apparatus 1 may be improved and the production cost of the display panel 10 and the display apparatus 1 may be reduced.

In some other examples, the boundary line of the orthographic projection of the inorganic encapsulation layer 131 on the substrate 110 partially coincides with the boundary line of the orthographic projection of the inorganic dielectric layer 210 on the substrate 110. In this case, during the preparation process of the inorganic dielectric layer 210, an inorganic dielectric film may be first formed on the encapsulation layer, and then the inorganic dielectric film may be patterned to form the inorganic dielectric layer 210. Since the material of the inorganic encapsulation layer 131 is also an inorganic material, an over-etching process can be used in the patterning process of the inorganic dielectric film to simultaneously etch the inorganic encapsulation layer in the encapsulation layer. That is, the inorganic encapsulation thinned portion 131*s* located under the inorganic dielectric film will be etched simultaneously, thereby removing the inorganic encapsulation thinned portion 131*s*, so that the boundary of the inorganic encapsulation layer 131 partially coincides with the boundary of the inorganic dielectric layer 210.

By using the above-described setting method, the existence of the inorganic encapsulation thinned portion 131*s* can be avoided, the peeling between the inorganic encapsulation thinned portion 131*s* and the inorganic dielectric layer 210 can be avoided, and the touch function layer 200 can be prevented from being peeled off from the display substrate 100, so that the yield rate of the display panel 10 and the display apparatus 1 may be improved, and the production cost of the display panel 10 and the display apparatus 1 is reduced.

Figure 10:
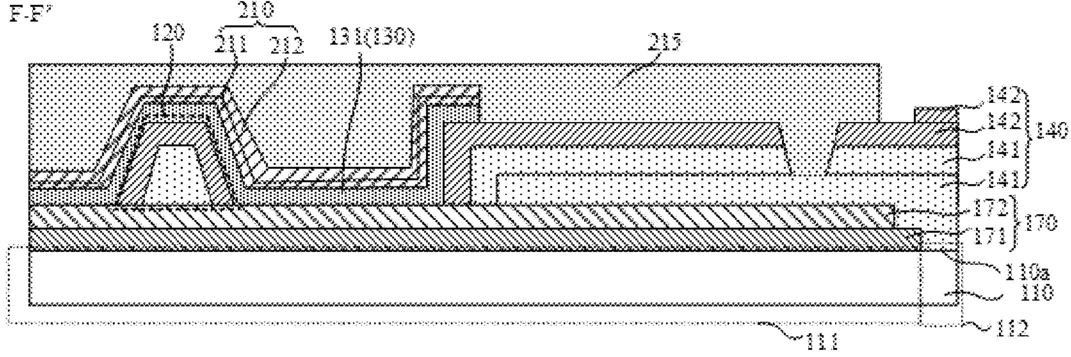
FIG. 10 is another sectional view of the display panel shown in FIG. 8*a* taken along the line F-F'.

In some embodiments, as shown in FIGS. 9 and 10, the area of the orthographic projection of the inorganic encapsulation layer 131 on the substrate 110 is less than or equal to the area of the orthographic projection of the inorganic dielectric layer 210 on the substrate 110.

Figure 8B:
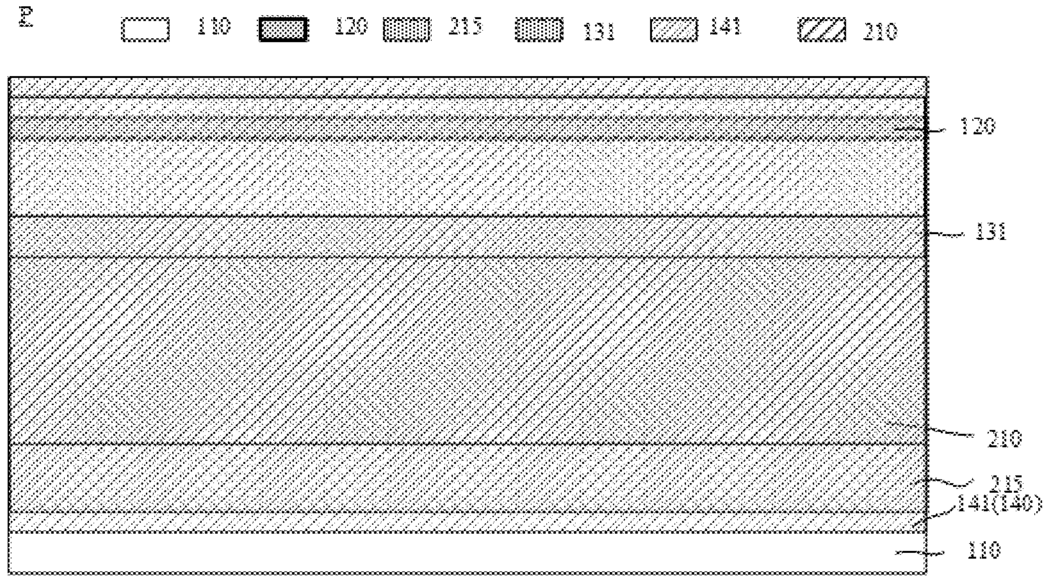
FIG. 8*b* is a partial enlarged view of some film layers in the P region of the display panel shown in FIG. 8*a;*
Figure 8C:
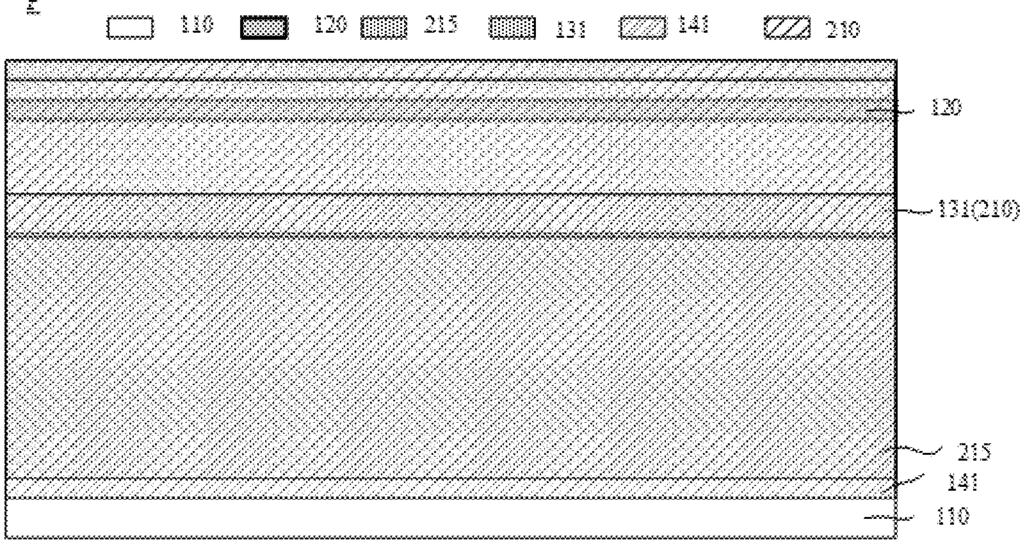
FIG. 8*c* is a partial enlarged view of some other film layers in the P region of the display panel shown in FIG. 8*a;*

In some examples, as shown in FIG. 8*c*, the area of the orthographic projection of the inorganic encapsulation layer 131 on the substrate 110 is equal to the area of the orthographic projection of the inorganic dielectric layer 210 on the substrate 110.

For example, the area of a portion of the substrate 110 covered by the inorganic encapsulation layer 131 is the same as the area of a portion of the substrate 110 covered by the inorganic dielectric layer 210.

For example, the boundary line of the orthographic projection of the inorganic encapsulation layer 131 on the substrate 110 may coincide with the boundary line of the orthographic projection of the inorganic dielectric layer 210 on the substrate 110. In this case, during the preparation process of the inorganic dielectric layer 210, an inorganic dielectric film may be first formed on the encapsulation layer, and then the inorganic dielectric film may be patterned to form the inorganic dielectric layer 210. Since the material of the inorganic encapsulation layer 131 is also an inorganic material, an over-etching process can be used in the patterning process of the inorganic dielectric film to simultaneously etch the inorganic encapsulation layer in the encapsulation layer. That is, the inorganic encapsulation thinned portion 131*s* located under the inorganic dielectric film will be etched simultaneously, thereby removing the inorganic encapsulation thinned portion 131*s*, so that the boundary of the inorganic encapsulation layer 131 coincides with the boundary of the inorganic dielectric layer 210.

By using the above-described setting method, the existence of the inorganic encapsulation thinned portion 131*s* can be avoided, the peeling between the inorganic encapsulation thinned portion 131*s* and the inorganic dielectric layer 210 can be avoided, and the touch function layer 200 can be prevented from being peeled off from the display substrate 100, so that the yield rate of the display panel 10 and the display apparatus 1 may be improved, and the production cost of the display panel 10 and the display apparatus 1 is reduced.

In some other examples, as shown in FIG. 8*b*, the area of the orthographic projection of the inorganic encapsulation layer 131 on the substrate 110 is less than the area of the orthographic projection of the inorganic dielectric layer 210 on the substrate 110.

For example, the area of a portion of the substrate 110 covered by the inorganic encapsulation layer 131 is less than the area of a portion of the substrate 110 covered by the inorganic dielectric layer 210.

By using the above-described setting method, in a case where the inorganic encapsulation layer 131 includes the inorganic encapsulation thinned portion 131*s*, the inorganic dielectric layer 210 can cover the inorganic encapsulation thinned portion 131*s*, and the inorganic dielectric layer 210 is in contact with at least a portion of the organic structure 140, thereby increasing the bonding force of the interface between the inorganic dielectric layer 210 and the display substrate 100, reducing the risk of peeling off the inorganic dielectric layer 210 and the display substrate 100, so that the yield rate of the display panel 10 and the display apparatus 1 may be improved, and the production cost of the display panel 10 and the display apparatus 1 is reduced.

In some examples, a distance between the first barrier wall 120 and the inorganic encapsulation layer 131 ranges from: 80 μm to 130 μm.

Here, the distance between the first barrier wall 120 and the inorganic encapsulating layer 131 refers to a distance between the first barrier wall 120 and an edge of the inorganic encapsulating layer 131 proximate to the first barrier wall 120.

For example, the distance between the first barrier wall 120 and the inorganic encapsulation layer 131 is 80 μm, 100 μm, 110 μm, 121 μm or 130 μm.

The above-described setting method may effectively prevent water vapor from invading the inorganic encapsulation layer 131 across the first barrier wall 120 to the display area A of the display panel 10, thus ensuring the encapsulation effect of the inorganic encapsulation layer 131 and improving the yield rate of the display panel 10 and the display apparatus 1.

In some examples, as shown in FIG. 10, at least a portion of the boundary of the inorganic encapsulation layer 131 is flush with at least a portion of the boundary of the inorganic dielectric layer 210. That is to say, the boundary line of the orthographic projection of the inorganic encapsulation layer 131 on the substrate 110 at least partially coincides with the boundary line of the orthographic projection of the inorganic dielectric layer 210 on the substrate 110.

For example, in a case where an over-etching process is used to etch the entire inorganic dielectric film, the entire inorganic encapsulation thinned portion 131*s* will be removed, and the entire boundary of the inorganic encapsulation layer 131 and the entire boundary of the inorganic dielectric layer 210 will be flush.

For example, in a case where an over-etching process is used to etch a portion of the inorganic dielectric film, a portion of the inorganic encapsulation thinned portion 131*s* will be removed, and a portion of the boundary of the inorganic encapsulation layer 131 and a portion of the inorganic dielectric layer 210 will be flush.

By using the above-described setting method, the manufacturing process of the inorganic encapsulation layer 131 and the inorganic dielectric layer 210 may be simplified.

In some examples, as shown in FIG. 9, the inorganic dielectric layer 210 covers at least a portion of the boundary of the inorganic encapsulation layer 131.

For example, as shown in FIG. 9, without removing the inorganic encapsulation thinned portion 131*s*, the inorganic dielectric layer 210 covers the entire boundary of the inorganic encapsulation layer 131. The entire boundary line of the orthographic projection of the inorganic encapsulation layer 131 on the substrate 110 may be located inside the boundary line of the orthographic projection of the inorganic dielectric layer 210 on the substrate 110.

For example, in a case where a portion of the inorganic encapsulation thinned portion 131*s* is removed, the inorganic dielectric layer 210 covers a portion of the boundary of the inorganic encapsulation layer 131, and the inorganic dielectric layer 210 covers the unremoved portion of the inorganic encapsulation thinned portion 131*s*. A portion of the boundary line of the orthographic projection of the inorganic encapsulation layer 131 on the substrate 110 is located inside the boundary line of the orthographic projection of the inorganic dielectric layer 210 on the substrate 110. FIG. 10 schematically shows a partial view of the display panel corresponding to the position where a portion of the inorganic encapsulation thinned portion 131*s* is removed in a case where the portion of the inorganic encapsulation thinned portion 131*s* is removed.

By using the above-described setting method, in a case where the inorganic encapsulation layer 131 includes the inorganic encapsulation thinned portion 131*s*, the inorganic dielectric layer 210 can cover the inorganic encapsulation thinned portion 131*s*, and the inorganic dielectric layer 210 is in contact with at least a portion of the organic structure 140, thereby increasing the bonding force of the interface between the inorganic dielectric layer 210 and the display substrate 100, reducing the risk of peeling off the inorganic dielectric layer 210 and the display substrate 100, so that the yield rate of the display panel 10 and the display apparatus 1 may be improved, and the production cost of the display panel 10 and the display apparatus 1 is reduced. In addition, the inorganic dielectric layer 210 covers the inorganic encapsulation layer 131, and the inorganic dielectric layer 210 covers at least a portion of the boundary of the inorganic encapsulation layer 131. The encapsulation effect of the inorganic encapsulation layer 131 may be enhanced, thereby improving the light-emitting performance and light-emitting life of the light-emitting devices 102, thereby reducing the production cost of the display panel 10 and the display apparatus 1.

In some examples, as shown in FIG. 10, the inorganic dielectric layer 210 includes an inorganic barrier layer 211 and a second inorganic insulating layer 212 stacked in sequence.

For example, the inorganic barrier layer 211 and the second inorganic insulating layer 212 may both be made of inorganic insulating materials, such as silicon nitride (SiNx).

The inorganic blocking layer 211 can be used to block impurity ions and the like from entering the touch function layer 200.

The second inorganic insulating layer 212 can be used to achieve electrical insulation.

Figure 11:
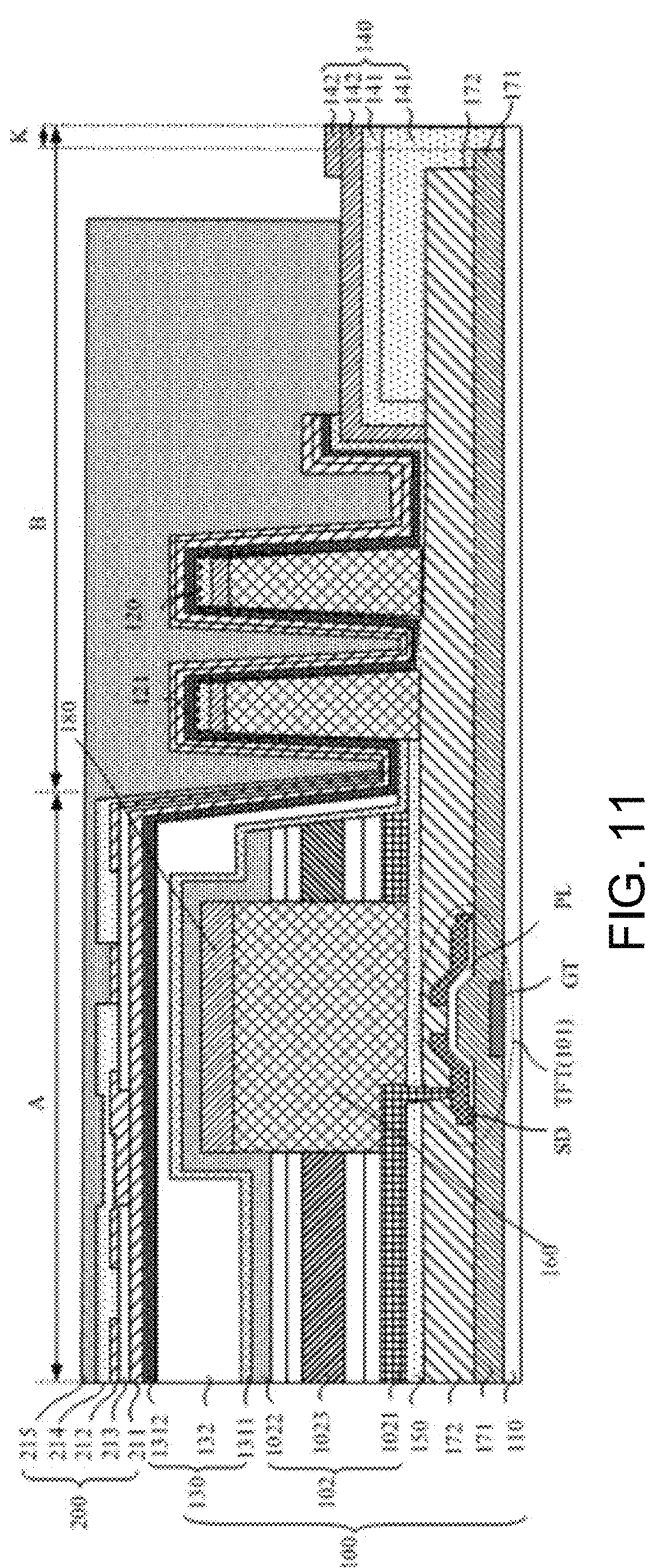
FIG. 11 is a structural diagram of yet another display panel, in accordance with some embodiments of the present disclosure.

In some examples, as shown in FIG. 11, the touch function layer 200 further includes a first touch electrode layer 213, a second touch electrode layer 214, and a protective layer 215.

For example, the first touch electrode layer 213 is provided between the inorganic barrier layer 211 and the second inorganic insulating layer 212.

For example, the second touch electrode layer 214 is provided on a side of the second inorganic insulating layer 212 away from the inorganic barrier layer 211.

For example, the second touch electrode layer 214 includes a plurality of second touch patterns, and the plurality of second touch patterns constitute a plurality of transmitting electrode blocks and a plurality of receiving electrode blocks for implementing the touch function. For example, the first touch electrode 213 includes a plurality of first touch patterns, and the plurality of first touch patterns may be used as bridge patterns for the above-mentioned transmitting electrode blocks or receiving electrode blocks.

For example, the first touch electrode layer 213 may be formed by stacking two oxide film layers and one metal film layer, such as indium tin oxide/silver/indium tin oxide (ITO/Ag/ITO); alternatively, the first touch electrode layer 213 may be formed by stacking three metal film layers, such as titanium/aluminum/titanium (Ti/Al/Ti).

The first touch electrode layer 213 and the second touch electrode layer 214 may be made of the same or different materials.

For example, the first touch electrode layer 213 and the second touch electrode layer 214 are located in the display area A. The first touch electrode layer 213 and the second touch electrode layer 214 cooperate with each other to implement the touch function of the display area A.

For example, the protective layer 215 is provided on a side of the second touch electrode layer 214 away from the inorganic barrier layer 211.

For example, the protective layer 215 may be made of an organic material. Optionally, the material of the protective layer 215 may be PI.

For example, the protective layer 215 covers the boundary of the inorganic dielectric layer 210.

For example, the orthographic projection of the inorganic dielectric layer 210 on the substrate 110 is located within a range of the orthographic projection of the protective layer 215 on the substrate 110. The protective layer 215 is used to protect the inorganic dielectric layer 210 of the touch function layer 200 from external damage. In addition, the protective layer 215 also has a planarizing effect, making the surface of the touch function layer 200 relatively flat.

In some examples, the touch function layer 200 further includes a plurality of touch traces.

For example, the plurality of touch traces are located in the peripheral area B and the bending portion 112 of the substrate 110. One end of each touch trace is connected to a first touch pattern of the first touch electrode layer 213 or a second touch pattern of the second touch electrode layer 214, and the other end of each touch trace is connected to a bonding pin, which is connected to the driver chip. The touch signal sent by the driver chip may be transmitted to the first touch pattern of the first touch electrode layer 213 or the second touch pattern of the second touch electrode layer 214 via the bonding pin and the touch trace; and the driver chip may also receive touch information from the first touch pattern and the second touch pattern via the bonding pin and the touch trace, so as to realize the touch function of the display panel 10.

For example, the material of the plurality of touch traces may be the same as the material of the first touch electrode layer 213, and the plurality of touch traces may be arranged in the same layer as the first touch electrode layer 213. As a result, the plurality of touch traces and the first touch electrode layer 213 may be manufactured simultaneously, which is beneficial to simplifying the manufacturing process of the display panel 10 and the display apparatus 1.

For example, the material of the plurality of touch traces may be the same as the material of the second touch electrode layer 214, and the plurality of touch traces may be arranged in the same layer as the second touch electrode layer 214. As a result, the plurality of touch traces and the second touch electrode layer 214 may be manufactured simultaneously, which is beneficial to simplifying the manufacturing process of the display panel 10 and the display apparatus 1.

Of course, a part of the plurality of touch traces may be arranged in the same layer as the first touch electrode layer 213, and the other part of the plurality of touch traces may be arranged in the same layer as the second touch electrode layer 214. As a result, multiple touch traces and the first touch electrode layer 213 may be manufactured simultaneously, and multiple touch traces and the second touch electrode layer 214 may be manufactured simultaneously, which is beneficial to simplifying the manufacturing process of the display panel 10 and the display apparatus 1.

In some examples, the manufacturing process of the touch function layer 200 is shown in FIG. 7.

In S10, the inorganic encapsulation layer 131 is formed on the surface of the display substrate 100, and the water process is used to clean the surface of the inorganic encapsulation layer 131.

In S20, the inorganic barrier layer 211 is formed on the surface of the inorganic encapsulation layer 131, and the water process is used to clean the surface of the inorganic barrier layer 211 away from the display substrate 100.

In S30, the first touch electrode layer 213 is formed on the surface of the inorganic barrier layer 211 away from the inorganic encapsulation layer 131. The first touch electrode layer 213 includes the plurality of first touch patterns. The plurality of first touch patterns are located in the display area A of the display panel 10.

In S40, the second inorganic insulating layer 212 is formed on the surface of the first touch electrode layer 213 away from the inorganic barrier layer 211, and a water cleaning process is used to clean the surface of the second inorganic insulating layer 212 away from the first touch electrode layer 213.

In S50, the second touch electrode layer 214 is formed on the surface of the second inorganic insulating layer 212 away from the first touch electrode layer 213. The second touch electrode layer 214 includes the plurality of second touch patterns, and the plurality of second touch patterns are located in the display area A.

In S60, the protective layer 215 is formed on the surface of the second touch electrode layer 214 away from the second inorganic insulating layer 212.

In some examples, as shown in FIG. 8*a*, the substrate 110 includes a main portion 111 and a bending portion 112 connected to the main portion 111.

For example, a part of the main portion 111 is located in the display area A of the display panel 10, and the other part of the main portion 111 is located in the peripheral area B of the display panel 10. The bending portion 112 may be located in the bending region K of the display panel 10.

For example, the display substrate 100 includes bonding pins. The bonding pins are electrically connected to the driver chip. The bonding pins can receive signals from the driver chip and transmit the signals to signal lines or pixel driving circuits 101.

For example, the bonding pins may be located on the bending portion 112 of the substrate 110. During the preparation process of the display panel 10, the bonding pins may be placed on the non-light-exit side of the display panel 10 with the bending portion 112 of the substrate 110, whereby the size of the bezel in the display panel 10 may be reduced, thereby facilitating the narrow bezel design of the display panel 10 and the display apparatus 1.

In some examples, the first barrier wall 120 is located at the main portion 111, so the first barrier wall 120 is not bent.

In some examples, as shown in FIG. 9, in a case where the organic layer in the organic structure 140 includes multiple organic layers, the multiple organic layers include: at least one first organic layer 141 and at least one second organic layer 142 located on a side of the at least one first organic layer 141 away from the substrate 110.

For example, the multiple organic layers in the organic structure 140 include: one first organic layer 141 and one second organic layer 142.

As another example, the multiple organic layers in the organic structure 140 include: two first organic layers 141 and one second organic layer 142.

For example, the first organic layer 141 is closer to the substrate 110 than the second organic layer 142.

The arrangement of the multiple organic layers may effectively avoid cracks in the display panel 10 during the bending process, and prevent cracks from spreading on the display panel 10 if cracks occur.

For example, the organic structure 140 further includes: a groove structure 145.

It will be noted that the depth of the groove structure 145 may be set according to the actual situation, and the present disclosure does not limit this.

For example, the depth of the groove structure 145 may be less than the thickness of the organic structure 140.

For example, as shown in FIGS. 9 and 10, the organic structure 140 includes two first organic layers 141 and two second organic layers 142, and one second organic layer 142 is only located at the bending portion 112 of the substrate 110. In this case, the depth of the groove structure 145 may be the same as the sum of the thicknesses of one second organic layer 142 and one first organic layer 141 (referring here to the adjacent second organic layer 142 and the first organic layer 141).

As another example, the organic structure 140 includes one first organic layer 141 and one second organic layer 142, and the second organic layer 142 is located at the bending portion 112 and the main portion 111 of the substrate 110. In this case, the depth of the groove structure 145 may be the same as the thickness of the second organic layer 142.

For example, there may be multiple groove structures 145.

By using the above-described setting method, when the organic structure 140 is subjected to external force, the organic structure 140 can release a portion of the force at the groove structure 145, thereby effectively preventing the occurrence of cracks, or preventing the spread of cracks if the cracks occur.

It can be understood that there are various positional relationships between the multiple organic layers of the organic structure 140 and between the multiple organic layers and the substrate 110, which can be set according to actual needs, and the present disclosure does not limit this.

For example, the at least one first organic layer 141 is located at the main portion 111 and the bending portion 112, and the at least one second organic layer 142 is located at least at the bending portion 112.

For example, in a case where the organic structure 140 includes one first organic layer 141 and one second organic layer 142, the first organic layer 141 is located at the main portion 111 and the bending portion 112, and a portion of the second organic layer 142 is located at the bending portion 112.

As another example, in a case where the organic structure 140 includes two first organic layers 141 and two second organic layers 142, one first organic layer 141 is located at the main portion 111 and the bending portion 112, and the other first organic layer 141 is also located at the main portion 111 and the bending portion 112, one second organic layer 142 is located only at the bending portion 112, and the other is also located only at the bending portion 112.

For example, the above-mentioned multiple organic layers are sequentially stacked on the substrate 110. The area of an orthographic projection of each organic layer on the substrate 110 may be different, and corresponding boundary lines of the organic layers may be partially overlapping. Of course, the area of the orthographic projection of each organic layer on the substrate 110 may also be the same, and the corresponding boundary lines of the organic layers may completely overlap.

For example, a portion of the multiple organic layers provided in correspondence with the bending portion 112 of the substrate 110 will be bent with the bending portion 112 during the preparation process of the display panel 10, and due to the flexibility of the material of the organic layers, cracks on the display panel 10 may be avoided and the spreading of cracks may be slowed down, which in turn may effectively reduce the risk of cracks on the display panel 10 and improve the quality of the display panel 10.

In some examples, as shown in FIG. 11, the display substrate 100 further includes: at least one planarization layer 150 provided on the first side 110*a* of the substrate 110, and a pixel defining layer 160 provided on a side of the planarization layer 150 away from the substrate 110.

For example, one planarization layer 150 is provided on the first side 110*a* of the substrate 110, in this case, the display panel 10 may have a single SD structure. The planarization layer 150 may be provided between the pixel driving circuits 101 of the display substrate 100 and the first electrodes 1021 of the light-emitting devices 102, for realizing electrical insulation between the source-drain conductive layer SD in the pixel driving circuits 101 and the first electrodes 1021.

For example, two planarization layers 150 are provided on the first side 110*a* of the substrate 110, in this case, the display panel 10 may have a double SD structure. One of the planarization layers 150 may be provided between the pixel driving circuits 101 of the display substrate 100 and the first electrodes 1021 of the light-emitting devices 102, for realizing electrical insulation between a source-drain conductive layer SD in the pixel driving circuits 101 and the first electrodes 1021; and the other of the planarization layers 150 may be provided between two source-drain conductive layers SD in the pixel driving circuits 101 of the display substrate 100, for realizing electrical insulation between the two source-drain conductive layers SD.

For example, materials of the planarization layer 150 and the pixel defining layer 160 are both organic materials.

For example, the pixel defining layer 160 is provided on a side of the first electrodes 1021 away from the substrate 110. A plurality of openings are provided in the pixel defining layer 160. A first electrode 1021 is exposed by an opening, and an opening is provided corresponding to a first electrode 1021, so that crosstalk between the light emitted by adjacent light-emitting devices 102 may be avoided.

In some examples, the display substrate 100 further includes spacers 180 provided on a side of the pixel defining layer 160 away from the substrate 110.

For example, the spacers 180 may be made of an organic insulating material.

For example, the spacers 180 may be distributed in the display area A and the peripheral area B.

For example, during the evaporation process of the light-emitting function layers 1023 in the light-emitting devices 102, the spacers 180 can be used to support the high-precision metal mask (Fine Metal Mask, FMM for short) to improve the evaporation effect of the FMM, thereby improving the light-emitting performance of the light-emitting function layers 1023 and the light-emitting devices 102.

In some examples, the first organic layer 141 and the planarization layer 150 are arranged in the same layer, and the second organic layer 142 and the pixel defining layer 160 are arranged in another same layer.

For example, the first organic layer 141 and the planarization layer 150 may be made of the same material, such as an organosiloxane resin, which has good leveling properties. Thus, the planarization layer 150 formed on the pixel driving circuits 101 may provide a flat base for the first organic layer 141 formed subsequently, so that the first organic layer 141 formed may further improve the flatness of a surface of the organic structure 140.

For example, the second organic layer 142 and the pixel defining layer 160 may be made of the same material, such as polyacrylate.

By using the above-described setting method, the patterns of the first organic layer 141 and the planarization layer 150 may be produced simultaneously, and the patterns of the second organic layer 142 and the pixel defining layer 160 may be produced simultaneously, which is beneficial to simplifying the manufacturing process of the display panel 10 and the display apparatus 1.

In a case where the display substrate 100 includes the spacers 180, the second organic layer 142 may also be provided in the same layer as the spacers 180. Therefore, the second organic layer 142 and the spacers 180 may be produced simultaneously, which is beneficial to simplifying the manufacturing process of the display panel 10 and the display apparatus 1.

In some embodiments, as shown in FIG. 8*a*, a shape of the display panel 10 includes an approximate rectangle.

For example, the above-mentioned approximate rectangle is not a rectangle in the strict sense. For example, the vertex corners of the approximate rectangle may be rounded corners. The overall outline of the display panel 10 is in a shape of an approximate rectangle.

For example, the peripheral area B includes a first side edge, a second side edge, a third side edge and a fourth side edge. The fourth side edge is provided corresponding to the bending portion, and the fourth side edge and the second side edge are located on opposite sides of the display area A.

For example, the first side edge and the third side edge described above are portions on the left and right sides of the display panel 10 in FIG. 2, the second side edge is a portion on the upper side of the display panel 10 in FIG. 2, and the fourth side edge is a portion on the lower side of the display panel 10 in FIG. 2.

In some examples, in a case where the organic structure 140 includes one first organic layer 141 and at least one second organic layer 142, the first organic layer 141 is located within a region corresponding to the first side edge, the second side edge, the third side edge and the fourth side edge, and the at least one second organic layer 142 is located within a region corresponding to the fourth side edge.

For example, in a case where the organic structure 140 includes one first organic layer 141 and two second organic layers 142, the first organic layer 141 is located within the region corresponding to the four side edges, i.e., the first side edge, the second side edge, the third side edge and the fourth side edge, of the display panel 10, and the two second organic layers 142 are located within the region corresponding to the fourth side edge.

In addition, in a case where the organic structure 140 includes two first organic layers 141 and two second organic layers 142, the two first organic layers 141 are located within the region corresponding to the first side edge, the second side edge, the third side edge and the fourth side edge, and the two second organic layers 142 are located within the region corresponding to the fourth side edge. FIGS. 9 and 10 illustrate a case where the two first organic layers 141 and the two second organic layers 142 are all located in the region corresponding to the fourth side edge.

By using the above-described setting method, in the process of bending the bending region K of the display panel 10 to form a curved screen, the above-described organic structure 140 may cushion the bending stress to which the display panel 10 is subjected to avoid cracks on the first side edge, the second side edge, and the third side edge of the display panel 10; and in the process of bending the bending portion 112 of the display panel 10, so that the bending portion 112 is placed on the back side of the display panel 10 to realize a narrow bezel design of the display panel, the organic structure 140 and the groove structure 145 above-described may cushion the bending stress to which the display panel 10 is subjected, avoiding cracks on the fourth side edge of the display panel 10, and thereby improving the quality of the display panel 10.

Figure 12:
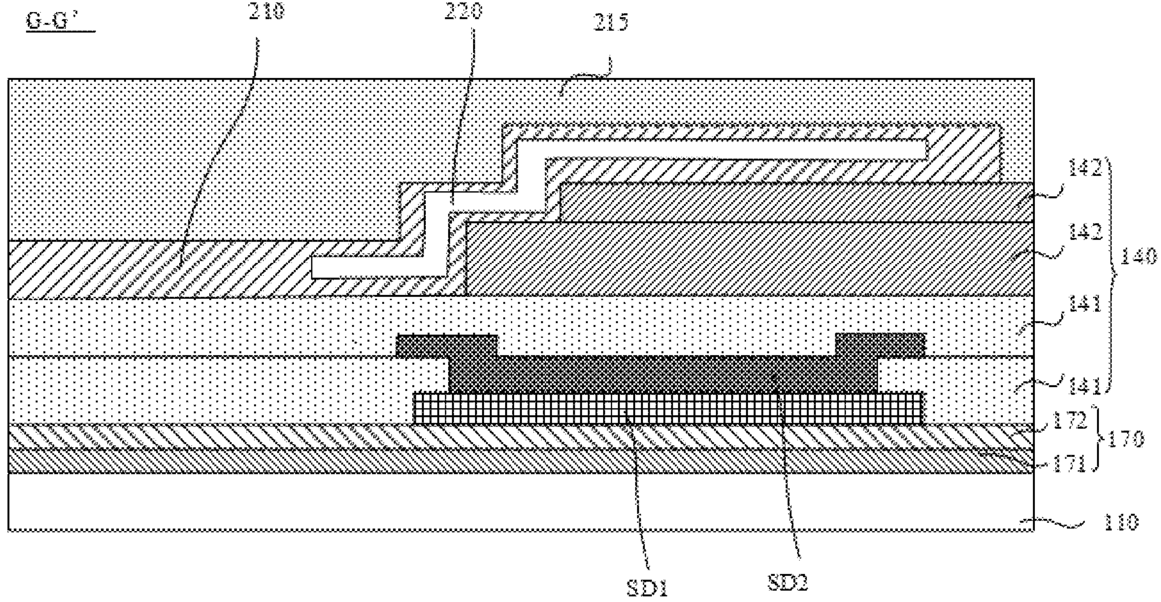
FIG. 12 is another sectional view of the display panel shown in FIG. 8*a* taken along the line G-G'.

In some examples, as shown in FIG. 12, the touch function layer 200 further includes an anti-crack structure 220.

For example, the anti-crack structure 220 and the first touch electrode layer 213 are arranged in the same layer. That is to say, the anti-crack structure 220 is located between the inorganic barrier layer 211 and the second inorganic insulating layer 212. In this way, patterns of the anti-crack structure 220 and the first touch electrode layer 213 can be produced simultaneously, which is beneficial to simplifying the manufacturing process of the display panel 10 and the display apparatus 1.

For example, the material of the anti-crack structure 220 is the same as the material of the first touch electrode layer 213.

For example, the material of the anti-crack structure 220 may include metal or metal oxide. Since the metal or metal oxide has a certain flexibility, the anti-crack structure 220 can release a certain amount of stress in a case where the touch function layer 200 is subjected to external stress, preventing the touch function layer 200 from producing cracks that affect the touch function of the display panel 10.

For example, the anti-crack structure 220 is further located at the bending portion 112, and an orthographic projection of the anti-crack structure 220 on the substrate 110 is located within a range of an orthographic projection of the second inorganic insulating layer 212 on the substrate 110.

For example, the boundary line of the orthographic projection of the anti-crack structure 220 on the substrate 110 is located within the boundary line of the orthographic projection of the second inorganic insulating layer 212 on the substrate 110.

By using the above-described setting method, in the process of bending the bending portion 112 of the substrate 110 by an external force, the external force is transmitted to the touch function layer 200 and is released on the anti-crack structure 220, which in turn prevents cracks from occurring in the inorganic dielectric layer 210 of the touch function layer 200 and slows down the propagation of the cracks in the case of cracks, and thus ensures the touch function of the display panel 10.

In some examples, the orthographic projection of the anti-crack structure 220 on the substrate 110 is non-overlapping with the orthographic projection of the first barrier wall 120 on the substrate 110.

For example, there is a certain distance between the boundary line of the orthographic projection of the anti-crack structure 220 on the substrate 110 and the boundary line of the orthographic projection of the first barrier wall 120 on the substrate 110, a portion of the substrate 110 covered by the anti-crack structure 220 has no overlap with a portion of the substrate 110 covered by the first barrier wall 120.

In some examples, the orthographic projection of the anti-crack structure 220 on the substrate 110 partially overlaps with the orthographic projection of the organic structure 140 on the substrate 110.

For example, the boundary line of the orthographic projection of the anti-crack structure 220 on the substrate 110 intersects the boundary line of the orthographic projection of the organic structure 140 on the substrate 110, and a portion of the substrate 110 covered by the anti-crack structure 220 has an overlap with a portion of the substrate 110 covered by the organic structure 140. The anti-crack structure 220 may be in the form of a step, and a portion of the anti-crack structure 220 may be lapped on the organic structure 140.

By using the above-described setting method, in the process of applying an external force to the bending region K of the display panel 10 for bending treatment, the organic structure 140 and the anti-crack structure 220 can release the external force, which in turn can reduce the generation of cracks and avoid the spreading of cracks, which in turn can avoid affecting the display and touch functions of the display panel 10.

In some examples, the orthographic projection of the anti-crack structure 220 on the substrate 110 is non-overlapping with the orthographic projection of the first barrier wall 120 on the substrate 110, and the orthographic projection of the anti-crack structure 220 on the substrate 110 partially overlaps with the orthographic projection of the organic structure 140 on the substrate 110.

By using the above-described setting method, in the process of applying an external force to the bending region K of the display panel 10 for bending treatment, the organic structure 140 and the anti-crack structure 220 can release the external force, which in turn can reduce the generation of cracks and prevent the spreading of cracks if the cracks are generated, which in turn can avoid affecting the display and touch functions of the display panel 10.

In some examples, as shown in FIGS. 10 and 11, the display substrate 100 further includes multiple first inorganic insulating layers 170 provided on the first side **110*a* of the substrate 110, and the multiple first inorganic insulating layers 170 include at least a gate dielectric layer 171 and an interlayer dielectric layer 172**.

For example, the multiple first inorganic insulating layers 170 include one gate dielectric layer 171 and one interlayer dielectric layer 172.

As another example, the multiple first inorganic insulating layers 170 include multiple gate dielectric layers 171 and multiple interlayer dielectric layers 172.

For example, the gate dielectric layer 171 is closer to the substrate 110 than the interlayer dielectric layer 172.

For example, the gate dielectric layer 171 is disposed between the active layer PL and the gate conductive layer GT in the above-mentioned pixel circuit layer, and is used to isolate the active layer PL from the gate conductive layer GT, thereby realizing the electrical insulation between the active layer PL and the gate conductive layer GT.

For example, the interlayer dielectric layer 172 is disposed between the gate conductive layer GT and the source-drain conductive layer SD in the above-mentioned pixel circuit layer, and is used to isolate the gate conductive layer GT from the source-drain conductive layer SD, thereby realizing the electrical insulation between the gate conductive layer GT and the source-drain conductive layer SD.

For example, the multiple first inorganic insulating layers 170 are located in the display area A of the display panel 10 and in a portion of the peripheral area B except for the bending region K.

For example, a portion of the substrate 110 covered by each of the multiple first inorganic insulating layers 170 may have the same or different area.

For example, in a case where a portion of the substrate 110 covered by each of the multiple first inorganic insulating layers 170 has the same area, the boundaries of the multiple first inorganic insulating layers 170 may overlap.

As another example, in a case where portions of the substrate 110 covered by the multiple first inorganic insulating layers 170 have different areas, the boundaries of the multiple first inorganic insulating layers 170 may partially overlap. And non-overlapping boundaries among the boundaries of the multiple first inorganic insulating layers 170 may form steps on the first side **110*a* of the substrate 110**.

In some examples, the multiple first inorganic insulating layers 170 further include: a buffer layer and a barrier layer disposed between the substrate 110 and the gate dielectric layer 171.

For example, the buffer layer is used to block the intrusion of water vapor from the substrate 110 to the light-emitting device 102, thereby protecting the light-emitting device 102.

For example, the barrier layer is used to block water vapor and impurity ions from intruding into the light-emitting device 102 from one side of the substrate 110, thereby protecting the light-emitting device 102.

In some examples, as shown in FIG. 9, the first barrier wall 120 and the organic structure 140 are both located on a side of the multiple first inorganic insulating layers 170 away from the substrate 110.

For example, the inorganic encapsulation layer 131 is in contact with a portion, located between the first barrier wall 120 and the organic structure 140, of the multiple first inorganic insulating layers 170.

For example, as shown in FIG. 9, there is a certain distance between the first barrier wall 120 and the organic structure 140. The inorganic encapsulation layer 131 and the multiple first inorganic insulating layers 170 are in contact with each other within this distance.

By using the above-described setting method, the boundary of the inorganic encapsulation layer 131 and the surface of the multiple first inorganic insulating layers 170 away from the substrate 110 can be in contact with each other. The inorganic encapsulation layer 131 and the first inorganic insulating layer 170 are both made of inorganic materials, the bonding force of the interface between the two is relatively large, which can reduce the risk of peeling off of the inorganic encapsulation layer 131, thereby improving the yield rate of the display panel 10 and the display apparatus 1, and reducing the production cost of the display panel 10 and the display apparatus 1.

As another example, as shown in FIGS. 9 and 10, there is a certain distance between the first barrier wall 120 and the organic structure 140. The inorganic encapsulation layer 131 and the multiple first inorganic insulating layers 170 are in contact with each other within this distance, and the inorganic dielectric layer 210 and the inorganic encapsulation layer 131 are in contact with each other within the distance.

By using the above-described setting method, the boundary of the inorganic encapsulation layer 131 and the surface of the multiple first inorganic insulating layers 170 away from the substrate 110 can be in contact with each other. The inorganic encapsulation layer 131 and the first inorganic insulating layer 170 are both made of inorganic materials, the bonding force of the interface between the two is relatively large, which can reduce the risk of peeling off of the inorganic encapsulation layer 131, thereby improving the yield rate of the display panel 10 and the display apparatus 1, and reducing the production cost of the display panel 10 and the display apparatus 1. In addition, the inorganic dielectric layer 210 and the inorganic encapsulation layer 131 are in contact with each other, and the bonding force of the interface between the inorganic dielectric layer 210 and the inorganic encapsulation layer 131 is also large, which can reduce the risk of the inorganic dielectric layer 210 peeling off from the display substrate 100, and thus the yield rate of the display panel 10 and the display apparatus 1 may be improved, and the production cost of the display panel 10 and the display apparatus 1 may be reduced.

In some examples, an orthographic projection of the gate dielectric layer 171 as shown in FIG. 9 on the substrate 110 is located within a range of an orthographic projection of the protective layer 215 on the substrate 110.

For example, a boundary line of the orthographic projection of the gate media layer 171 on the substrate 110 is located within a boundary line of the orthographic projection of the protective layer 215 on the substrate 110.

By using the above-described setting method, the protective layer 215 can be closer to the bending region K relative to the gate dielectric layer 171, so that when the display panel 10 is bent, the protective layer 215 plays a certain protective role on the gate dielectric layer 171.

For example, a distance between the boundary line of the orthographic projection of the protective layer 215 on the substrate 110 and the boundary line of the orthographic projection of the gate dielectric layer 171 on the substrate 110 ranges from: 5 μm to 15 μm.

For example, the distance between the boundary line of the orthographic projection of the protective layer 215 on the substrate 110 and the boundary line of the orthographic projection of the gate dielectric layer 171 on the substrate 110 may be 5 μm, 7 μm, 10 μm, 12 μm or 15 μm.

In some examples, an orthographic projection of an interlayer dielectric layer 172 on the substrate 110 is located within a range of an orthographic projection of the inorganic dielectric layer 210 on the substrate 110.

For example, a boundary line of the orthographic projection of the interlayer dielectric layer 172 on the substrate 110 is located within a boundary line of the orthographic projection of the inorganic dielectric layer 210 on the substrate 110.

For example, a distance between a boundary line of the orthographic projection of the inorganic dielectric layer 210 on the substrate 110 and a boundary line of the orthographic projection of the interlayer dielectric layer 172 on the substrate 110 ranges from: 5 μm to 15 μm.

For example, the distance between the boundary line of the orthographic projection of the inorganic dielectric layer 210 on the substrate 110 and the boundary line of the orthographic projection of the interlayer dielectric layer 172 on the substrate 110 may be 5 μm, 7 μm, 10 μm, 12 μm or 15 μm.

In some examples, as shown in FIG. 11, the display substrate 100 further includes at least one second barrier wall 121 disposed between the display area A and the first barrier wall 120, and the second barrier wall 121 surrounds the display area A.

For example, the display area A and the first barrier wall 120 may be provided therebetween with one or two second barrier walls 121.

For example, the first barrier wall 120 and the at least one second barrier wall 121 are both used to block the material of the organic encapsulation layer.

For example, the height of the first barrier wall 120 and the height of the second barrier wall 121 may be the same or different, which may be set according to the actual situation, and the present disclosure does not limit this.

For example, the structure of the second barrier wall 121 may be the same as the structure of the first barrier wall 120 and is not described herein.

The formation process of the first barrier wall 120 will be described below. Of course, there are many processes for forming the first barrier wall 120, which may be selected according to the actual situation, and the present disclosure does not limit this.

Taking the display panel 10 as a single SD structure as an example, the display panel 10 includes one planarization layer 150, one pixel defining layer 160 and one layer of spacers 180, and the display panel includes one first barrier wall 120 and two second barrier walls 121. First, a planarization layer film is formed, then the planarization layer film is patterned to form the planarization layer 150, and a patterned first sub-portion pattern is simultaneously formed at a position where the first barrier wall 120 is to be formed. Then, a pixel defining layer film is formed, then the pixel defining layer film is patterned to form the pixel defining layer 160, and a second sub-portion pattern is simultaneously formed at a position corresponding to the first sub-portion pattern. Then a spacer film is formed, then the spacer film is patterned to form the spacers 180, and a third sub-portion pattern is simultaneously formed at a position corresponding to the second sub-portion pattern. The first sub-portion pattern, the second sub-portion pattern and the third sub-portion pattern form the first barrier wall 120. Therefore, the height of the first barrier wall 120 is approximately the same as the sum of the thicknesses of the planarization layer 150, the pixel defining layer 160, and the spacers 180. In this case, the height of a second barrier wall 121 proximate to the display area A may be approximately the same as the sum of the thicknesses of the pixel defining layer 160 and the spacers 180; and the height of a second barrier wall 121 proximate to the first barrier wall 120 may be approximately the same as the height of the first barrier wall 120, that is, approximately the same as the sum of the thicknesses of the planarization layer 150, the pixel defining layer 160, and the spacers 180. Of course, the formation process of the two second barrier walls 121 is similar to the formation process of the above-mentioned first barrier wall 120 and will not be described again here.

In addition, in a case where the display panel 10 as a double SD structure as an example, the display panel 10 includes two planarization layers 150, one pixel defining layer 160 and one layer of spacers 180, and the display panel includes one first barrier wall 120 and two second barrier walls 121, the height of the first barrier wall 120 may be approximately the same as the sum of the thicknesses of the two planarization layers 150, the pixel defining layer 160, and the spacers 180; the height of a second barrier wall 121 proximate to the display area A may be approximately the same as the sum of the thicknesses of the second planarization layer 150, the pixel defining layer 160 and the spacers 180; and the height of a second barrier wall 121 proximate to the first barrier wall 120 may be approximately the same as the height of the first barrier wall 120, that is, approximately the same as the sum of the thicknesses of the two planarization layers 150, the pixel defining layer 160, and the spacers 180. Of course, the formation process of the two second barrier walls 121 is similar to the formation process of the above-mentioned first barrier wall 120 and will not be described again here.

The foregoing description is only specific embodiments of the present disclosure, but the scope of protection of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, having a display area and a peripheral area, and comprising:

a display substrate, including:

a substrate;

a first barrier wall provided on a first side of the substrate, wherein the first barrier wall is located in the peripheral area and surrounds the display area;

an organic structure provided on the first side of the substrate and surrounding the first barrier wall, wherein the organic structure includes at least one organic layer; and a film encapsulation layer provided on a side of the first barrier wall away from the substrate, wherein an inorganic encapsulation layer in the film encapsulation layer covers the first barrier wall, and an orthographic projection of the inorganic encapsulation layer on the substrate is non-overlapping with an orthographic projection of the organic structure on the substrate; and a touch function layer provided on a side of the film encapsulation layer away from the substrate, wherein the touch function layer includes an inorganic dielectric layer in contact with the film encapsulation layer, the inorganic dielectric layer covers the first barrier wall, and an orthographic projection of the inorganic dielectric layer on the substrate is non-overlapping with the orthographic projection of the organic structure on the substrate.

2. The display panel according to claim 1, wherein an area of the orthographic projection of the inorganic encapsulation layer on the substrate is less than or equal to an area of the orthographic projection of the inorganic dielectric layer on the substrate; or at least a portion of a boundary of the inorganic encapsulation layer is flush with at least a portion of a boundary of the inorganic dielectric layer; or the inorganic dielectric layer covers at least a portion of the boundary of the inorganic encapsulation layer.

3. The display panel according to claim 1, wherein the orthographic projection of the inorganic encapsulation layer on the substrate is located within a range of the orthographic projection of the inorganic dielectric layer on the substrate; or the orthographic projection of the inorganic encapsulation layer on the substrate coincides with the orthographic projection of the inorganic dielectric layer on the substrate.

4. The display panel according to claim 1, wherein the substrate includes a main portion and a bending portion connected to the main portion;

the first barrier wall is located at the main portion; and in a case where the at least one organic layer in the organic structure includes multiple organic layers, the multiple organic layers include: at least one first organic layer and at least one second organic layer located on a side of the at least one first organic layer away from the substrate, wherein the at least one first organic layer is located at the main portion and the bending portion, and the at least one second organic layer is located at at least the bending portion.

5. The display panel according to claim 4, wherein the display substrate further includes:

at least one planarization layer provided on the first side of the substrate; and a pixel defining layer provided on a side of the at least one planarization layer away from the substrate;

wherein a first organic layer in the at least one first organic layer and planarization layer in the at least one planarization layer are provided in a same layer, and a second organic layer in the at least one second organic layer and the pixel defining layer are provided in another same layer.

6. The display panel according to claim 4, wherein the display panel is in a shape of an approximate rectangle;

the display panel includes a first side edge, a second side edge, a third side edge and a fourth side edge, and the fourth side edge is provided in correspondence with the bending portion and opposite to the second side edge; and in a case where the organic structure includes one first organic layer and at least one second organic layer, the first organic layer is located within a region corresponding to the first side edge, the second side edge, the third side edge and the fourth side edge, and the at least one second organic layer is located within a region corresponding to the fourth side edge.

7. The display panel according to claim 1, wherein the display substrate further includes multiple first inorganic insulating layers provided on the first side of the substrate, and the multiple first inorganic insulating layers include at least a gate dielectric layer and an interlayer dielectric layer;

the first barrier wall and the organic structure are both located on a side of the multiple first inorganic insulating layers away from the substrate; and the inorganic encapsulation layer is in contact with a portion, located between the first barrier wall and the organic structure, of the multiple first inorganic insulating layers.

8. The display panel according to claim 1, wherein the inorganic dielectric layer includes an inorganic barrier layer and a second inorganic insulating layer stacked in sequence; and the touch function layer further includes:

a first touch electrode layer provided between the inorganic barrier layer and the second inorganic insulating layer;

a second touch electrode layer provided on a side of the second inorganic insulating layer away from the inorganic barrier layer, wherein the first touch electrode layer and the second touch electrode layer are located in the display area; and a protective layer provided on a side of the second touch electrode layer away from the inorganic barrier layer, wherein the protective layer covers at least a portion of the organic structure.

9. The display panel according to claim 1, wherein the display substrate further includes at least one second barrier wall provided between the display area and the first barrier wall, and the second barrier wall surrounds the display area.

10. A display apparatus, comprising the display panel according to claim 1.

11. A display panel, having a display area and a peripheral area, and comprising:

a display substrate, including:

a substrate;

a first barrier wall provided on a first side of the substrate, wherein the first barrier wall is located in the peripheral area and surrounds the display area;

an organic structure provided on the first side of the substrate and surrounding the first barrier wall, wherein the organic structure includes at least one organic layer; and a film encapsulation layer provided on a side of the first barrier wall away from the substrate, wherein an inorganic encapsulation layer in the film encapsulation layer covers the first barrier wall, and an orthographic projection of the inorganic encapsulation layer on the substrate partially overlaps with an orthographic projection of the organic structure on the substrate; and a touch function layer provided on a side of the film encapsulation layer away from the substrate, wherein the touch function layer includes an inorganic dielectric layer in contact with the film encapsulation layer; and the orthographic projection of the inorganic encapsulation layer on the substrate is located within a range of an orthographic projection of the inorganic dielectric layer on the substrate, or the orthographic projection of the inorganic encapsulation layer on the substrate coincides with the orthographic projection of the inorganic dielectric layer on the substrate.

12. The display panel according to claim 11, wherein an area of the orthographic projection of the inorganic encapsulation layer on the substrate is less than or equal to an area of the orthographic projection of the inorganic dielectric layer on the substrate; or at least a portion of a boundary of the inorganic encapsulation layer is flush with at least a portion of a boundary of the inorganic dielectric layer; or the inorganic dielectric layer covers at least a portion of the boundary of the inorganic encapsulation layer.

13. The display panel according to claim 11, wherein the inorganic dielectric layer includes an inorganic barrier layer and a second inorganic insulating layer stacked in sequence; and the touch function layer further includes:

a first touch electrode layer provided between the inorganic barrier layer and the second inorganic insulating layer;

a second touch electrode layer provided on a side of the second inorganic insulating layer away from the inorganic barrier layer, wherein the first touch electrode layer and the second touch electrode layer are located in the display area; and a protective layer provided on a side of the second touch electrode layer away from the inorganic barrier layer, wherein the protective layer covers a boundary of the inorganic dielectric layer.

14. The display panel according to claim 13, wherein the substrate includes a main portion and a bending portion connected to the main portion;

the first barrier wall is located at the main portion; and in a case where the at least one organic layer in the organic structure includes multiple organic layers, the multiple organic layers include: at least one first organic layer and at least one second organic layer located on a side of the at least one first organic layer away from the substrate, wherein the at least one first organic layer is located at the main portion and the bending portion, and the at least one second organic layer is located at at least the bending portion.

15. The display panel according to claim 14, wherein the display panel is in a shape of an approximate rectangle;

the display panel includes a first side edge, a second side edge, a third side edge and a fourth side edge, and the fourth side edge is provided in correspondence with the bending portion and opposite to the second side edge; and in a case where the organic structure includes one first organic layer and at least one second organic layer, the first organic layer is located within a region corresponding to the first side edge, the second side edge, the third side edge and the fourth side edge, and the at least one second organic layer is located within a region corresponding to the fourth side edge.

16. The display panel according to claim 14, wherein the touch function layer further includes an anti-crack structure, and the anti-crack structure is provided in a same layer as the first touch electrode layer; and the anti-crack structure is located at the bending portion, and an orthographic projection of the anti-crack structure on the substrate is located within a range of an orthographic projection of the second inorganic insulating layer on the substrate.

17. The display panel according to claim 16, wherein the orthographic projection of the anti-crack structure on the substrate is non-overlapping with an orthographic projection of the first barrier wall on the substrate are; and/or the orthographic projection of the anti-crack structure on the substrate partially overlaps with the orthographic projection of the organic structure on the substrate.

18. The display panel according to claim 11, wherein the display substrate further includes multiple first inorganic insulating layers provided on the first side of the substrate, and the multiple first inorganic insulating layers include at least a gate dielectric layer and an interlayer dielectric layer;

the first barrier wall and the organic structure are both located on a side of the multiple first inorganic insulating layers away from the substrate; and the inorganic encapsulation layer is in contact with a portion, located between the first barrier wall and the organic structure, of the multiple first inorganic insulating layers.

19. The display panel according to claim 18, wherein an orthographic projection of the gate dielectric layer on the substrate is located within a range of an orthographic projection of a protective layer in the touch function later on the substrate, and a distance between a boundary of the orthographic projection of the protective layer on the substrate and a boundary of the orthographic projection of the gate dielectric layer on the substrate ranges from: 5 μm to 15 μm; and/or an orthographic projection of the interlayer dielectric layer on the substrate is located within a range of the orthographic projection of the inorganic dielectric layer on the substrate, and a distance between a boundary of the orthographic projection of the inorganic dielectric layer on the substrate and a boundary of the orthographic projection of the interlayer dielectric layer on the substrate ranges from: 5 μm to 15 μm.

20. A display apparatus, comprising the display panel according to claim 11.

* * * * *